(12) United States Patent
Miyamoto et al.

(10) Patent No.: US 6,504,222 B1
(45) Date of Patent: Jan. 7, 2003

(54) MULTI-QUANTUM WELL INFRARED PHOTO-DETECTOR

(75) Inventors: Yoshihiro Miyamoto, Kawasaki (JP); Hironori Nishino, Kawasaki (JP); Yusuke Matsukura, Kawasaki (JP); Toshio Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/473,156

(22) Filed: Dec. 28, 1999

(30) Foreign Application Priority Data

Dec. 28, 1998 (JP) .......................... 10-372154
May 7, 1999 (JP) .......................... 11-127278

(51) Int. Cl.$^7$ .......................... H01L 31/00; G01T 5/00
(52) U.S. Cl. ............... 257/440; 257/466; 250/338.1; 250/338.4; 250/339.02
(58) Field of Search .......................... 257/21, 440, 466, 257/431, 444; 438/48; 250/338.1, 338.4, 339.02

(56) References Cited

U.S. PATENT DOCUMENTS 5,185,648 A * 2/1993 Baker et al. ............... 257/189
6,034,407 A * 3/2000 Tennant et al. ............ 257/440
6,104,046 A * 8/2000 Borenstain ................ 257/185
6,157,020 A * 12/2000 Krapf et al. ............ 250/214 LA
6,184,538 B1 * 2/2001 Bandara et al. ........... 257/21

FOREIGN PATENT DOCUMENTS

JP              405021839     *  1/1993   .............. 257/440

* cited by examiner

Primary Examiner—Tom Thomas
Assistant Examiner—Donghee Kang
(74) Attorney, Agent, or Firm—Greer, Burns & Crain, Ltf.

(57) ABSTRACT

A multi-quantum well infrared photo-detector, in which a plurality of multi-quantum well layers having respective sensitivities for different wavelength ranges of infrared are layered via a common contact layer. The infrared photo-detector includes a switch where one end is connected to the above common contact layer, and a current integration unit which is connected to the other end of the above switch. First and second voltages are applied to first and second contact layers at the opposite side of first and second multi-quantum well layer respectively. The above switch is conducted for a predetermined time so that either voltage between the above common contact layer and the first contact layer or voltage between the above common contact layer and the second contact layer becomes higher than the other, and the above current integration unit is charged or discharged by the current which flows in the above multi-quantum well layers.

15 Claims, 16 Drawing Sheets

| T1 | T2 | OUTPUT |
|----|----|--------|
| ON | OFF | LWIR |
| OFF | ON | MWIR |

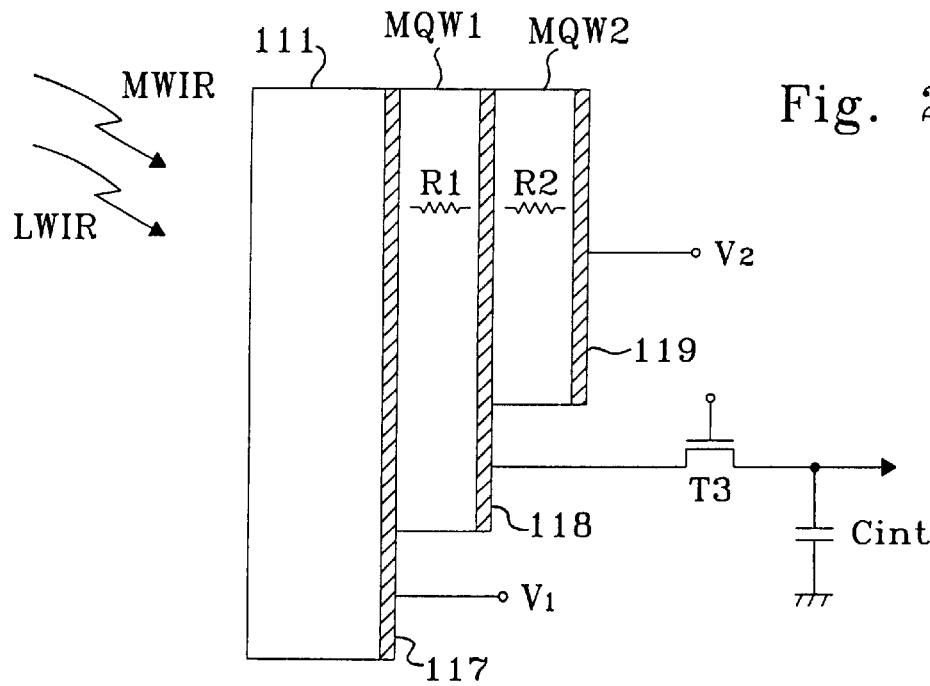
Fig. 2A
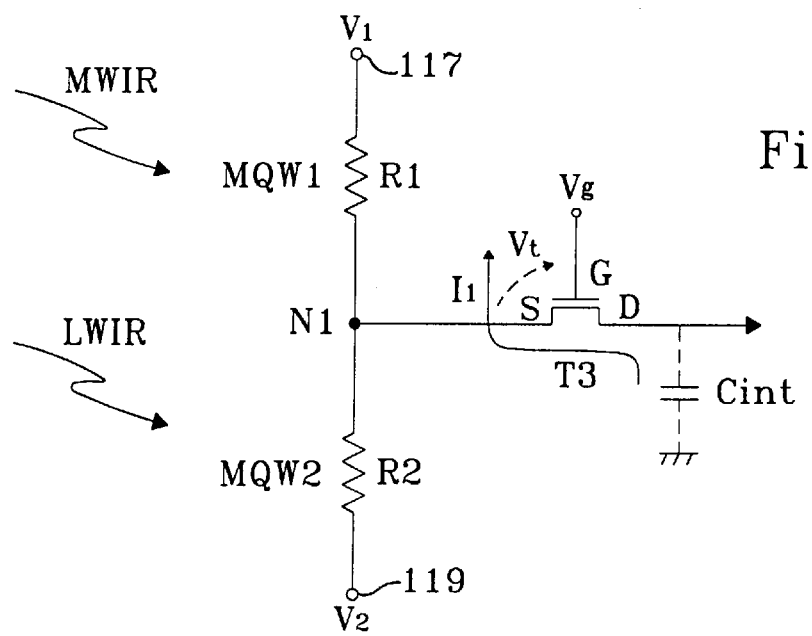
Fig. 2B
| | V₁ | V₂ | OUTPUT |
|---|---|---|---|
| a | −2[V] | 0[V] | LWIR |
| b | 0[V] | −2[V] | MWIR |
Fig. 2C

| | V3 | V4 | V5 | T4 | T5 | OUTPUT |
|---|---|---|---|---|---|---|
| a | −2[V] | 0[V] | 0[V] | ON | OFF | IR1 |
| b | 0[V] | −2[V] | 0[V] | ON | OFF | IR2 |
| c | 0[V] | −2[V] | 0[V] | OFF | ON | IR3 |
| d | 0[V] | 0[V] | −2[V] | OFF | ON | IR4 |

ONE-DIVISIONAL ARRAY

TWO-DIVISIONAL ARRAY

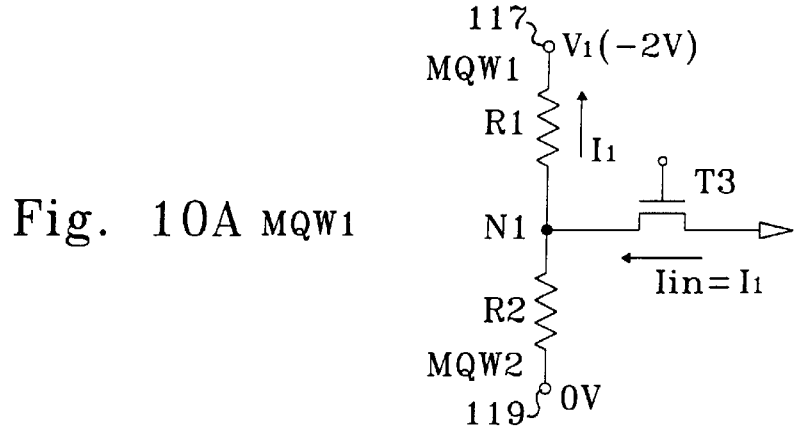
Fig. 10A MQW1
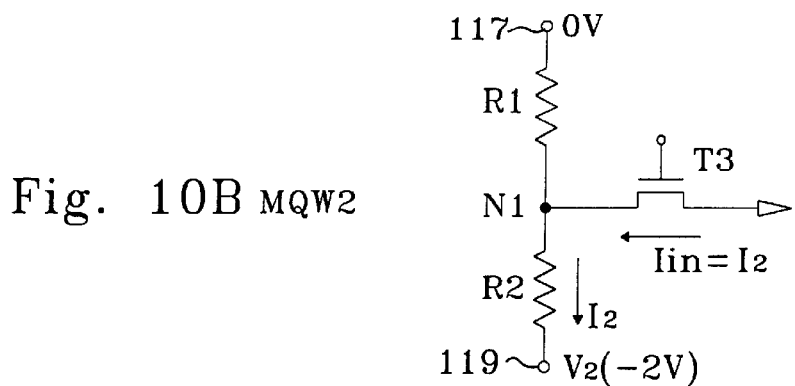
Fig. 10B MQW2
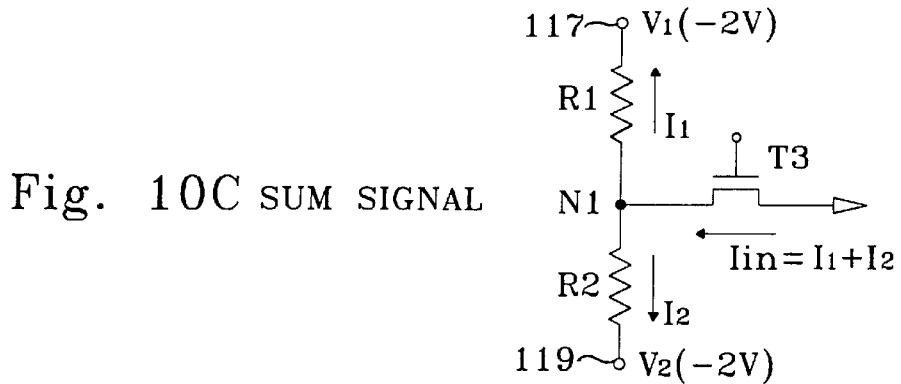
Fig. 10C SUM SIGNAL
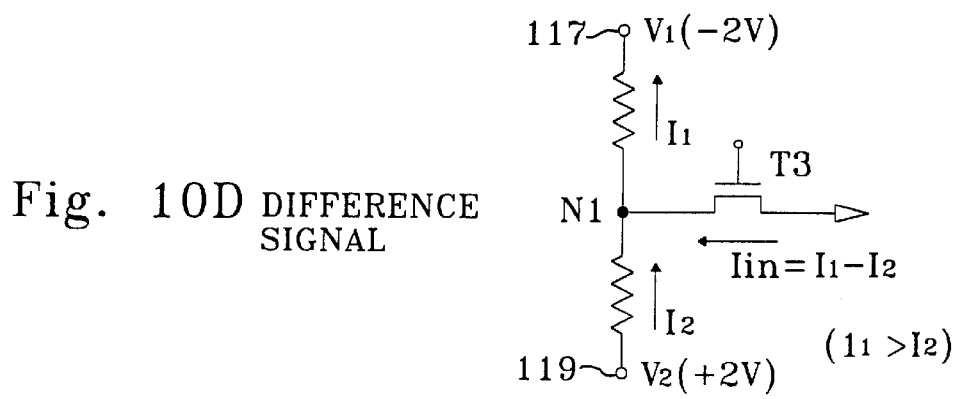
Fig. 10D DIFFERENCE SIGNAL

Fig. 16

| | | |
|---|---|---|
| 700nm | i-GaAs couplar | 47 |
| | i-AlGaAs stopper ≠ Al=0.30 | 70 |
| 500nm | i-GaAs insulator | 69 |
| | i-AlGaAs stopper ≠ Al=0.30 | 68 |
| 400nm | n-GaAs top contact | 46 |
| | MQW 2<br>(i-AlGaAs-40nm/n-GaAs-5nm x 20cycle ≠<br>Al =0.24) | 45 |
| 50nm | n-GaAs buffer | 67 |
| | n-InGap stopper | 66 |
| 400nm | n-GaAs middle contact | 44 |
| | MQW 1<br>(i-AlGaAs-40nm/n-GaAs-4nm x 20cycle ≠<br>Al =0.30) | 43 |
| 50nm | n-GaAs buffer | 65 |
| | n-InGap stopper | 64 |
| 100nm | n-GaAs bottom contact | 42 |
| 900nm | i-GaAs bridge | 41 |
| | n-InGap stopper | 63 |
| 100nm | GaAs buffer | 62 |
| | GaAs(100) substrate | 61 |

MULTI-QUANTUM WELL INFRARED PHOTO-DETECTOR

BACKGROUND OF THE INVENTION

1. Field of the Invention

The present invention relates to multi-quantum well infrared photo-detectors, photo-sensors and image sensors which acquire various information by receiving infrared.

2. Description of the Related Art

Systems for acquiring various information on a target object by receiving infrared irradiated from the target object and generating infrared images are widely used. In the search for underground resources of the earth, for example, oil and mineral veins are searched by observing the distribution of infrared irradiated from the earth by an infrared sensor mounted on an artificial satellite.

Among infrared sensors, quantum well infrared photo-detectors (QWIP), which can change the excitation level of electrons by changing the width of a quantum well, can control detecting wavelength ranges. Therefore if information on a plurality of wavelength ranges is acquired by quantum well infrared photo-detectors having a plurality of detecting wavelength ranges, a higher order of information can be acquired in applications to fields which require more detailed information, such as infrared sensors for weapons guidance and defense systems.

FIG. 1 is a rough configuration of a conventional multi-quantum well infrared photo-detector having two detecting wavelength ranges. In this multi-quantum well infrared photo-detector, a common electrode 114 is disposed on a substrate 111, such as GaAs, and a first multi-quantum well layer MQW1 for detecting long wavelength infrared (LWIR) having a wavelength of 8–10 $\mu$m is disposed thereon. Then on the first multi-quantum well layer MQW1, a second multi-quantum well layer MQW2 for detecting mid-wavelength infrared (MWIR) having a wavelength of 3–5 $\mu$m is disposed via a contact layer 115. And a transistor T1 for reading signals is connected to the contact layer 115, and a transistor T2 for reading signals is connected to the electrode 116 on the second multi-quantum well layer MQW2.

When the quantum well infrared photo-detector receives infrared in a detecting wavelength range, electrons at the ground state level are excited to the excited state level, and electrons which transit to the conduction band from the excited state level increase, and if bias voltage is applied at this time, current flows.

In other words, if bias voltage is applied, current increases or decreases depending on the quantity of infrared to be received, therefore the multi-quantum well infrared photo-detector can measure the quantity of infrared to be received by measuring the value of the current. In this case, the multi-quantum well infrared photo-detector can be regarded as an impedance element which value changes depending on the quantity of infrared to be received.

The impedance value of the multi-quantum well layer corresponds to the energy difference between the ground state level and the excited state level, where impedance is small when the energy difference is small, and impedance is large when the energy difference is large. A long wavelength infrared has lower energy, therefore the energy difference between the ground state level and the excited state level of the multi-quantum well layer, which absorbs the long wavelength infrared, is smaller. A mid-wavelength infrared has higher energy, therefore the energy difference between the ground state level and the excited state level of the multi-quantum well layer, which absorbs the mid-wavelength infrared, is larger. As a consequence, the impedance R1 of the first multi-quantum well layer MQW1, which detects the long wavelength infrared (LWIR), is smaller, and the impedance R2 of the second multi-quantum well layer MQW2, which detects the mid-wavelength infrared (MWIR), is larger, and the difference between them is extremely large, where R1<<R2 establishes.

So, if a bias voltage V0 is applied from the common electrode 114, the transistor T1 is controlled to be conductive, and the transistor T2 is controlled to be non-conductive, then the bias voltage V0 is applied only to the first multi-quantum well layer MQW1, and the long wavelength infrared (LWIR) is detected (see FIG. 1B).

If the transistor T1 is controlled to be non-conductive and the transistor T2 is controlled to be conductive, on the other hand, the bias voltage is applied mostly to the second multi-quantum well layer MQW2, where the impedance R2 is large, and is barely applied to the first multi-quantum well layer MQW1, where the impedance R1 is small. The change of impedance caused by receiving infrared is primarily influenced by the second multi-quantum well layer MQW2, where the impedance R2 is large, therefore only the reception of mid-wavelength infrared (MWIR) can be detected.

In this way, a conventional multi-quantum well infrared photo-detector reads the series of signals in a time sequence corresponding to two detecting wavelengths, using the difference between impedances R1 and R2 of the two multi-quantum well layers MQW1 and MQW2.

The conventional multi-quantum well infrared photo-sensor reads signals of 8–10 $\mu$m wavelengths of long wavelength infrared (LWIR) and 3–5 $\mu$m wavelengths of mid-wavelength infrared (MWIR) due to the fact that the impedance of the respective multi-quantum well layers has about a two digit difference.

However, when a multi-quantum well layer which detecting wavelength is 8–9 $\mu$m, and a multi-quantum well layer, which detecting wavelength is 9–10 $\mu$m, are layered, the detecting wavelength regions are close to each other, and the difference of impedance between the multi-quantum well layers decreases. As a result, the signals of the two multi-quantum well layers are modulated by each other, and cross-talk between the two signals increases, making it difficult to acquire information for each different wavelength.

SUMMARY OF THE INVENTION

With the foregoing in view, it is an object of the present invention to provide a multi-quantum well infrared photo-detector which can acquire signals from respective detecting wavelength ranges independently without generating cross-talk, and which can also directly acquire sum signals and difference signals of each signal, even if a plurality of detecting wavelength ranges are close to each other.

To achieve this object, the present invention provides a multi-quantum well infrared photo-detector, in which a plurality of multi-quantum well layers having respective sensitivities for different wavelength ranges of infrared are layered via a common contact layer, comprising a switch where one end is connected to the above common contact layer, and a current integration unit which is connected to the other end of the above switch; wherein first and second voltages are applied to first and second contact layers at the opposite side of first and second multi-quantum well layers which are formed on and under the above common contact layer respectively, the above switch is conducted for a predetermined time so that either voltage between the above common contact layer and the first contact layer or voltage between the above common contact layer and the second contact layer becomes higher than the other, and the above current integration unit is charged or discharged by the current which flows in the above multi-quantum well layers.

According to the present invention, bias voltage can be applied individually to multi-quantum well layers having different detecting wavelength ranges by the first and second voltages applied to the electrodes and switch, therefore only signals of the multi-quantum well layer where the bias voltage is applied can be detected without generating crosstalk.

BRIEF DESCRIPTION OF THE DRAWINGS

FIG. 2 is a drawing depicting a theoretical configuration of a multi-quantum well infrared photo-detector of the present invention and the equivalent circuit;

FIG. 10 is an explanatory drawing of the signal read mode in accordance with an embodiment of the present invention;

FIG. 11 is an explanatory drawing depicting the multi-quantum well infrared photo-detector in accordance with an embodiment of the present invention;

FIG. 16 is a drawing depicting a structure of a semiconductor layer to be used for the photo-sensor in FIG. 15;

DESCRIPTION OF THE PREFERRED EMBODIMENTS

Figures 1A, 1B:
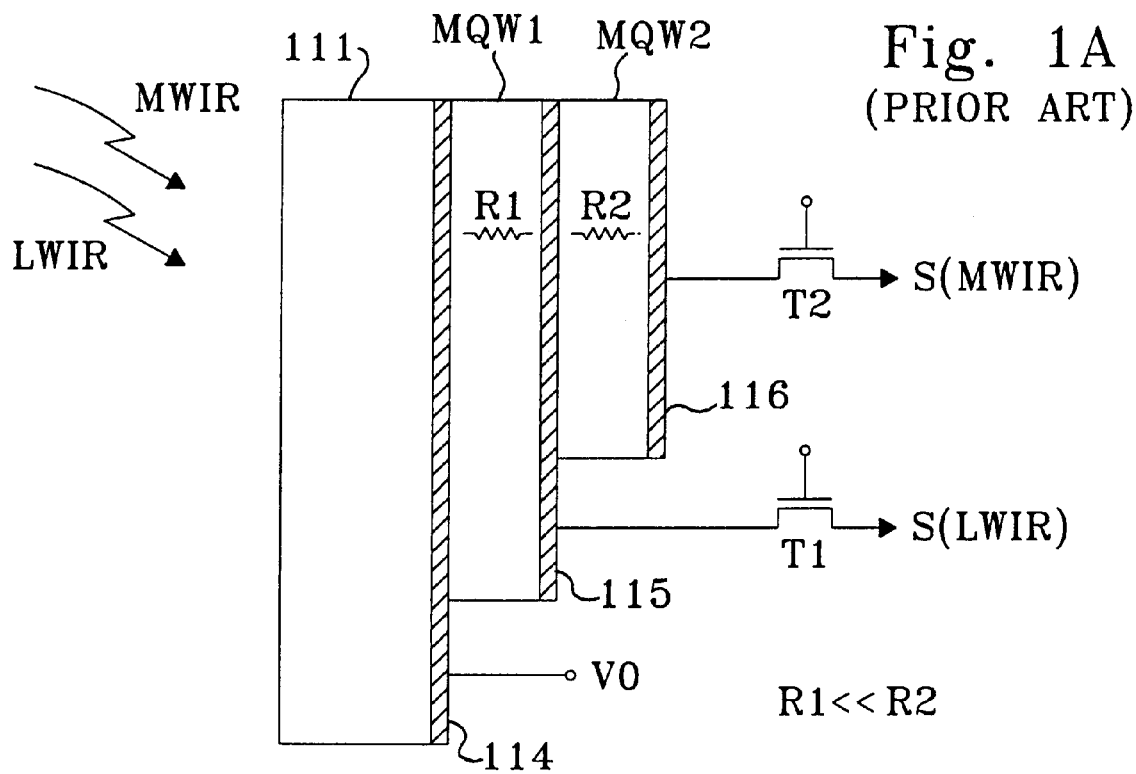
FIG. 1 is a drawing depicting a rough configuration of a conventional multi-quantum well infrared photo-detector.

Embodiments of the present invention will now be described with reference to the accompanying drawings. These embodiments, however, do not restrict the technical scope of the present invention.

FIG. 2 is a drawing depicting a theoretical configuration of a multi-quantum well infrared photo-detector having two detecting wavelength ranges in accordance with the present embodiment and the equivalent circuit. In the multi-quantum well infrared photo-detector of the present embodiment, a first electrode (first contact layer) 117 is disposed on a substrate 111, such as GaAs, and a first multi-quantum well layer MQW1 for detecting a 8–10 $\mu$m wavelength of long wavelength infrared (LWIR) is disposed thereon. Then on the first multi-quantum well layer MQW1, a second multi-quantum well layer MQW2 for detecting a 3–5 $\mu$m wavelength of mid-wavelength infrared (MWIR) is disposed on the first multi-quantum well layer MQW1 via a common contact layer 118. To the common contact layer 118, a transistor T3 for reading signals is connected as a switch, and a second electrode (second contact layer) 119 is disposed on the second multi-quantum well layer MQW2. To the other end of the switch T3, a capacitor Cint which integrates current flowing in the multi-quantum well layers MQW1 and MQW2 is connected.

As mentioned above, the multi-quantum well layers MQW1 and MQW2 can be regarded as resistors R1 and R2 which are modulated by infrared input, and the multi-quantum well infrared photo-detector in FIG. 2A is expressed by the equivalent circuit in FIG. 2B.

Next, operation of the multi-quantum well infrared photo-detector of the present embodiment will be explained with reference to FIG. 2B. According to the multi-quantum well infrared photo-detector of the present embodiment, the capacitor Cint is precharged with a predetermined voltage, and the bias voltage V1 or V2 is applied to either the first electrode 117 or the second electrode 119. In this state, a control voltage Vg is applied to the gate electrode of the transistor T3, so as to conduct the transistor T3 for a predetermined time .T.

In the multi-quantum well layers MQW1 and MWQ2, current according to the intensity of infrared in the detecting wavelength range flows, and charge in the capacitor Cint is discharged or recharged only when the bias voltage is applied. Therefore if the decrease or increase of the voltage in the capacitor Cint during the predetermined time .T is measured, then the intensity of infrared received by the multi-quantum well layer can be detected.

In this case, control voltage Vg close to the threshold voltage Vt between the gate and source of the transistor T3 is applied to the gate electrode of the transistor T3, and the conductance of the transistor T3 is controlled to be sufficiently high (and impedance to be sufficiently low). Therefore the voltage at the contract point N1 between the multi-quantum well layers MQW1 and MQW2 becomes a voltage which is a control voltage Vg ($\approx$Vt) minus the threshold voltage Vt between the gate and source, that is, roughly 0[V].

Therefore, if V1=−2[V] is applied to the first electrode 117, and V2=0[V] is applied to the second electrode 119, as shown in FIG. 2C a, then the discharge current I1 flows in the multi-quantum well layer MQW1 since the 2[V] of bias voltage is applied therein, but hardly any current flows in the multi-quantum well layer MQW2 since almost no bias voltage is applied therein. If V2=−2[V] is applied to the second electrode 119, and V1=0[V] is applied to the first electrode 117, on the other hand, then discharge current flows in the multi-quantum well layer MQW2 since 2[V] of bias voltage is applied therein, but hardly any current flows in the multi-quantum well layer MQW1 since almost no bias voltage is applied therein.

Figure 3:
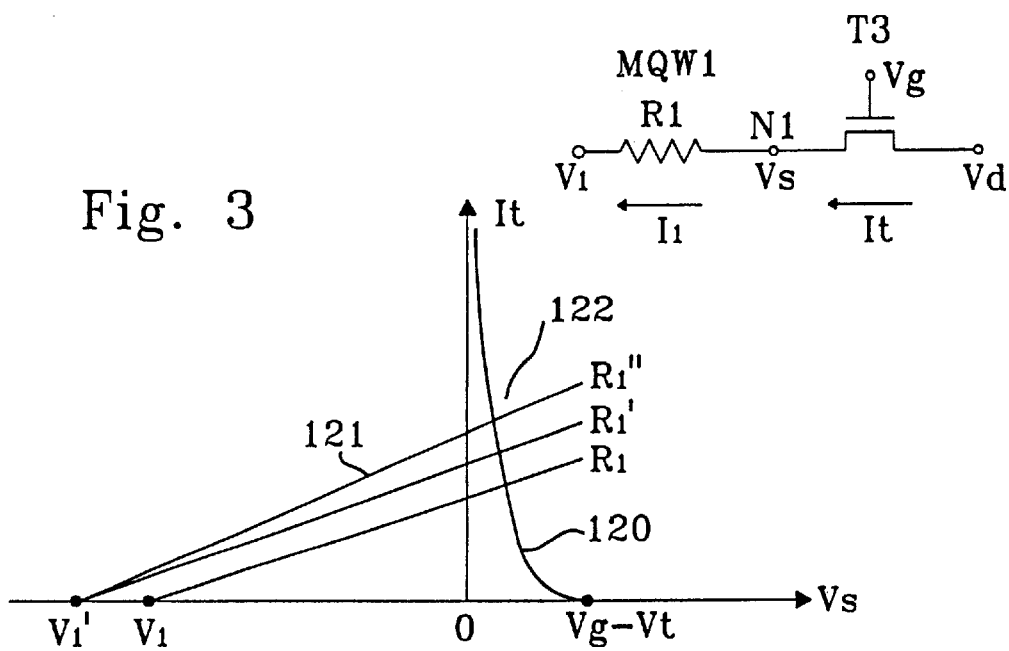
FIG. 3 is an explanatory drawing (I) of operating points of the multi-quantum well infrared photo-detector of the present invention.

The voltage at the contact point N1 between the multi-quantum well layers MQW1 and MQW2 is fixed to near 0[V] in this way, which will now be explained with reference to a characteristic diagram. FIG. 3 is an explanatory drawing of operating points when bias voltage V1 is applied to the multi-quantum well layer MQW1 (R1). When the abscissa denotes the source voltage Vs of the transistor T3, and the ordinate denotes the current It which flows in the transistor T3, the current It sharply rises in the region where the source voltage Vs is (Vg−Vt) or less, as the characteristic curve 120 shows. In other words, the impedance of the transistor T3 becomes sufficiently small. Here Vg and Vt are the gate voltage and threshold voltage of the transistor T3.

Since the current I1, which flows in the multi-quantum well layer MQW1, is denoted by the straight line 121 corresponding to the resistance value R1, the intersecting point between the characteristic curve 120 and the straight line 121 (point at It=I1) becomes the operating point 122. As a consequence, the voltage Vs of the operating point 122 is fixed to be near 0[V], even if bias voltage V1 is changed to V1' or if R1 is changed to R1' or R1" while the impedance of the transistor T3 is in a range sufficiently smaller than R1.

Figure 4:
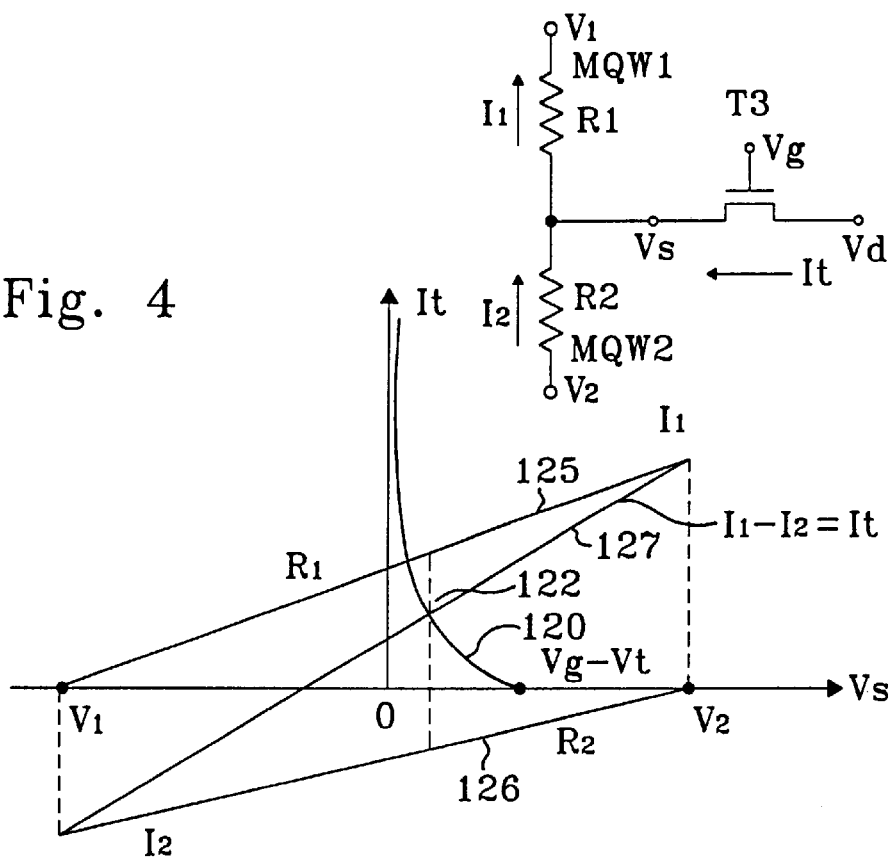
FIG. 4 is an explanatory drawing (II) of operating points of the multi-quantum well infrared photo-detector of the present invention.

FIG. 4 is an explanatory drawing of operating points when the bias voltage V1 is applied to the multi-quantum well layer MQW1 (R1) and the bias voltage V2, which polarity is opposite from V1, is applied to the multi-quantum well layer MQW2 (R2). The current I1 is denoted by the straight line 125 corresponding to the resistance value R1 and the current I2 is denoted by the straight line 126 corresponding to the resistance value R2. Since the current It, which is the current I1 minus the current I2, flows in the transistor T3, the operating point 122 in this case is an intersection point between the characteristic curve 120 and the straight line 127. Therefore, in this case the voltage Vs of the operating point 122 is fixed to be near 0[V] when I1>I2.

In this way, in the case of the multi-quantum well infrared photo-detector of the present embodiment, bias voltage can be applied individually to the multi-quantum well layers having different detecting wavelength regions by controlling such that the voltage Vs of the operating point 122 is fixed to be near 0[V] and voltages V1 and V2 of the first and second electrodes of the multi-quantum well layers become as shown in FIG. 2C. As a consequence, it is possible to detect only the signals of the multi-quantum well layer where the bias voltage is applied without generating cross-talk.

FIG. 5 is a schematic diagram depicting the multi-quantum well infrared photo-detector where the multi-quantum well layers are comprised of four layers. In this case, the first to fourth multi-quantum well layers MQW1, MQW2, MQW3 and MQW4 having different detecting wavelength ranges are layered, an electrode 130 for applying the voltage V3 is disposed at the top end of the first multi-quantum well layer MQW1, an electrode 131 for applying the voltage V4 is disposed at the connection point between the second and third multi-quantum well layers MQW2 and MQW3, and an electrode 132 for applying the voltage V5 is disposed at the bottom end of the fourth multi-quantum well layer MQW4. And a transistor T4 is connected to the connecting point N2, which corresponds to a common contact layer of the first and second multi-quantum well layers MQW1 and MQW2, and a transistor T5 is connected to the connecting point N3, which corresponds to a common contact layer of the third and fourth multi-quantum well layers MQW3 and MQW4.

Figures 5A, 5B:
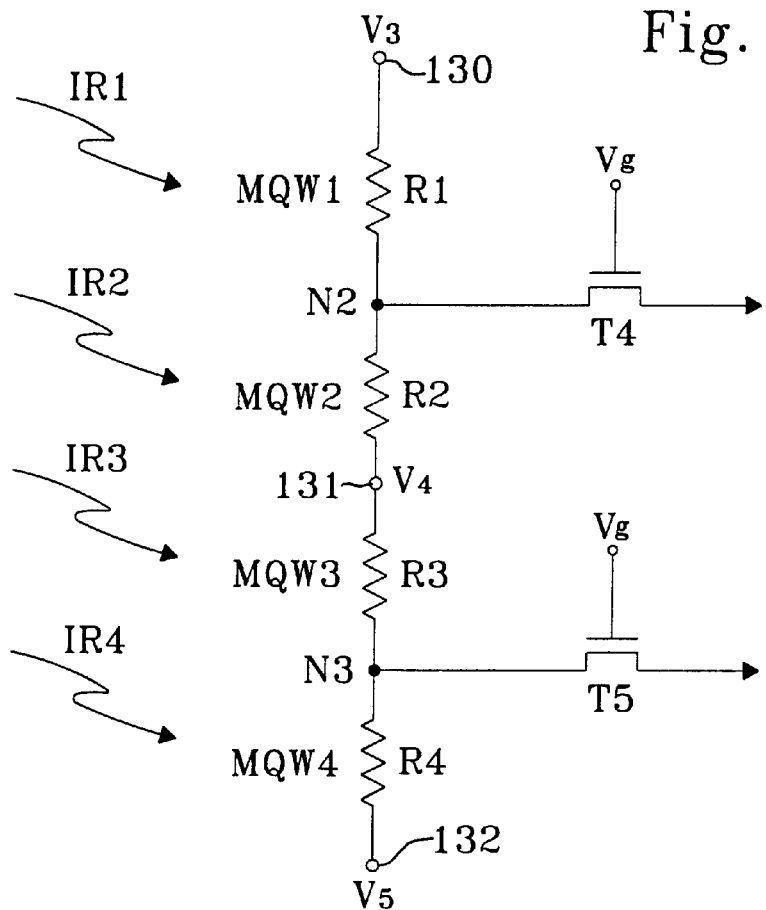
FIG. 5 is a schematic diagram depicting the multi-layer structured multi-quantum well infrared photo-detector of the present invention.

According to the multi-quantum well infrared photo-detector with this configuration, four different wavelength ranges of infrared can be detected independently without generating cross-talk. In other words, when the infrared IR1 having the detecting wavelength range of the first multi-quantum well layer MQW1 is detected, the setting is V3=−2[V], V4=V5=0[V], the transistor T4 ON and the transistor T5 OFF, as shown in FIG. 5B(a). In this case, if the gate voltage Vg of the transistor T4 is roughly the same as the threshold voltage Vt of the transistor T4, as mentioned above, then the voltage of the connecting point N2 becomes roughly 0[V], and only signals of the multi-quantum well layer MQW1 can be detected.

When the infrared IR2 with the detecting wavelength range of the second multi-quantum well layer MQW2 is detected, the setting is V4=−2[V], V3=V5=0[V], the transistor T4 ON and the transistor T5 OFF, as shown in FIG. 5B(b), when the infrared IR3 with the detecting wavelength of the third multi-quantum well layer MQW3 is detected, the setting is V4=−2[V], V3=V5=0[V], the transistor T4 OFF and the transistor T5 ON, as shown in FIG. 5B(c), and when the infrared IR4 with the detecting wavelength range of the fourth multi-quantum well layer MQW4 is detected, the setting is V5=−2[V], V3=V4=0 [V], the transistor T4 OFF and the transistor T5 ON, as shown in FIG. 5B(d).

Figure 6:
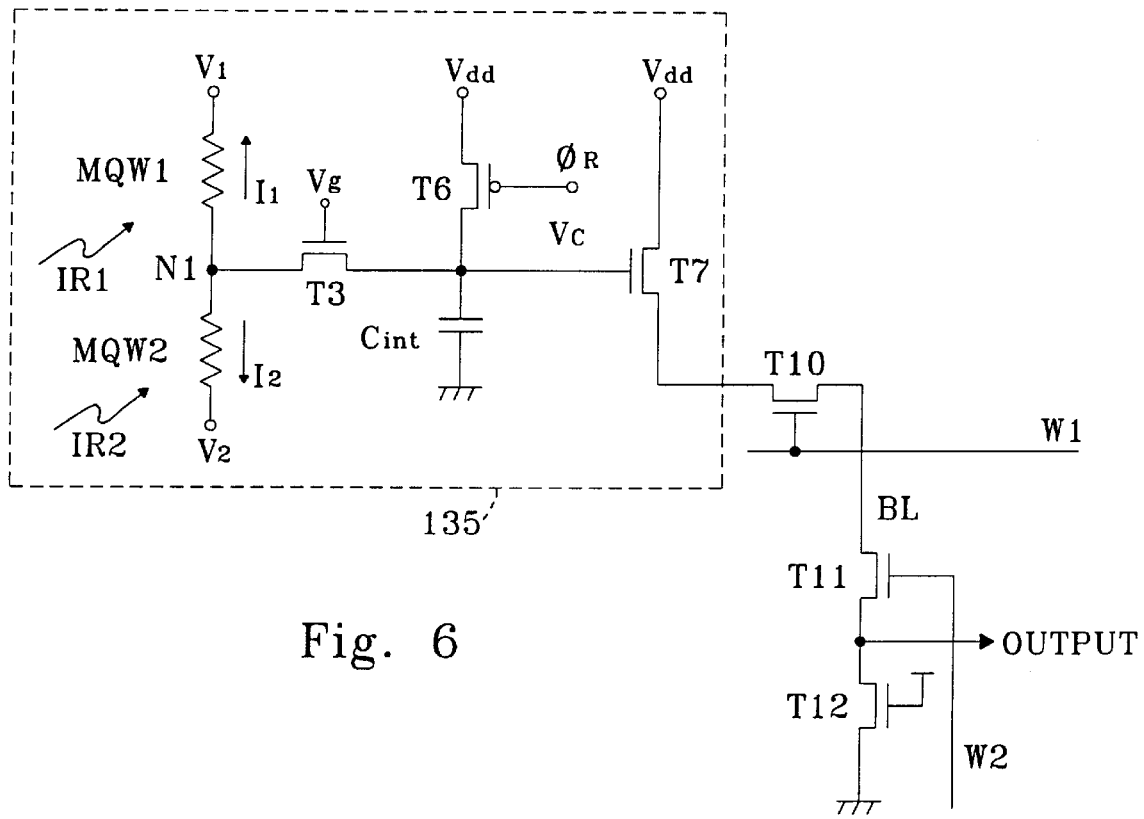
FIG. 6 is a drawing depicting the configuration of the multi-quantum well infrared photo-detector in accordance with the first embodiment of the present invention.

FIG. 6 is a drawing depicting the configuration of a unit cell 135 of the multi-quantum well infrared photo-detector in accordance with the first embodiment of the present invention. Just as in FIG. 2B, the multi-quantum well infrared photo-detector comprises a first multi-quantum well layer MQW1 for detecting infrared IR1, a second multi-quantum well layer MQW2 for detecting infrared IR2, a transistor T3 for reading signals and a capacitor Cint, and further comprises a reset transistor T6 for precharging the capacitor Cint and a source follower transistor T7 for outputting the charging voltage of the capacitor Cint with low impedance.

To detect infrared, reset signal ΦR is input to the gate of the transistor T6 to conduct the transistor T6, and the capacitor Cint is precharged with 5[V] of power supply Vdd, for example. And, as mentioned above, the bias voltage is applied to the multi-quantum well layers MQW1 and MQW2 having wavelength ranges to be detected by controlling the voltages V1 and V2, as mentioned above.

Then the controlling voltage Vg is input to the gate of the transistor T3 so as to conduct the transistor T3 for a predetermined time. The control voltage Vg is roughly the same as the threshold voltage Vt between the gate and source of the transistor T3, as mentioned above. As a result, the connecting point N1 between the MQW1 and MQW2 is fixed roughly to 0[V] and only the current value, according to the received infrared value in the multi-quantum well layer where bias voltage is applied, can be detected. The electric charges charged in the capacitor Cint are discharged by the current I1 or I2, which flows in the multi-quantum well layer where bias voltage is applied, and therefore the voltage Vc in the capacitor Cint becomes a voltage corresponding to the intensity of received infrared when a predetermined time elapses. The voltage Vc is output from the source terminal of the source follower transistor T7 at low impedance.

In FIG. 6, output of the source follower transistor T7 is output via the transistors T10 and T11 selected by the horizontal scanning line W1 and vertical scanning line W2, which will be described later.

Figure 7:
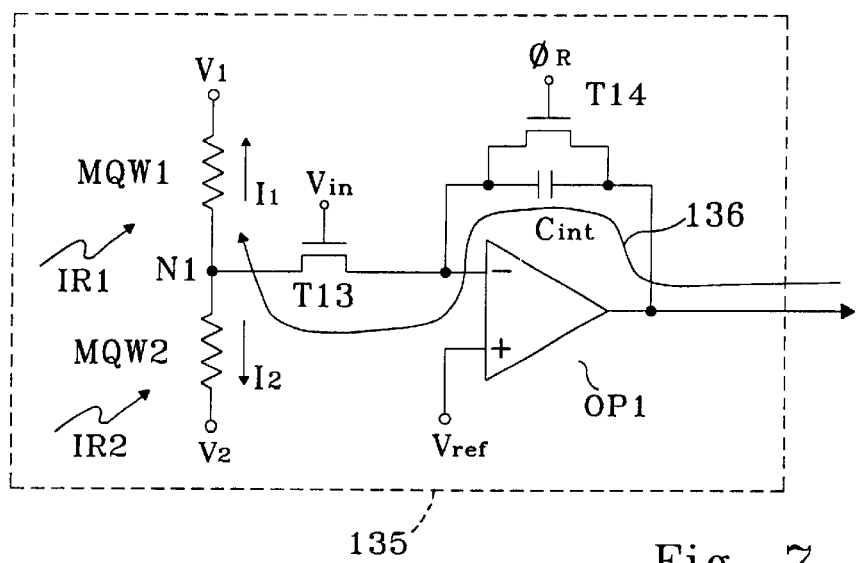
FIG. 7 is a drawing depicting the configuration of the multi-quantum well infrared photo-detector in accordance with the second embodiment of the present invention.

FIG. 7 is a drawing depicting the configuration of a unit cell 135 of the multi-quantum well infrared photo-detector in accordance with the second embodiment of the present invention. The multi-quantum well infrared photo-detector of the present embodiment comprises a first multi-quantum well layer MQW1 for detecting infrared IR1, a second multi-quantum well layer MQW2 for detecting infrared IR2, and a transistor T13 which operates as the switch, and further comprises a capacitor Cint for integrating the detected current, an operational amplifier OP1, and a reset transistor T14.

In the multi-quantum well infrared photo-detector of the present embodiment, the reset signal ΦR is input to the gate of the transistor T14 first to conduct the transistor T14 and electric charges charged in the capacitor Cint are discharged. And bias voltage is applied only to the multi-quantum well layer having the wavelength region to be detected by controlling the voltages V1 and V2, as mentioned above. On the non-inversion input terminal (+) of the operational amplifier OP1, reference voltage Vref=0[V] to be the virtual grounding is applied.

Then input signal Vin is input to the gate of the transistor T13 so as to conduct the transistor T13 only for a predetermined time. In this case, the transistor T13 operates as a switch and its voltage drop is almost zero. As a result, the connecting point N1 between MQW1 and MQW2 becomes the same as 0[V] of the reference voltage Vref, and the capacitor Cint is charged or discharged so as to maintain the state. In other words, the capacitor Cint is charged from the output terminal of the operational amplifier OP1 in the arrow direction 136 according to the current which flows in the multi-quantum well layer where the bias voltage is applied, therefore the voltage of the capacitor Cint becomes voltage corresponding to the intensity of received infrared when a predetermined time has elapsed. As a consequence, only received infrared in the multi-quantum well layer where the bias voltage is applied can be detected.

Figure 8A:
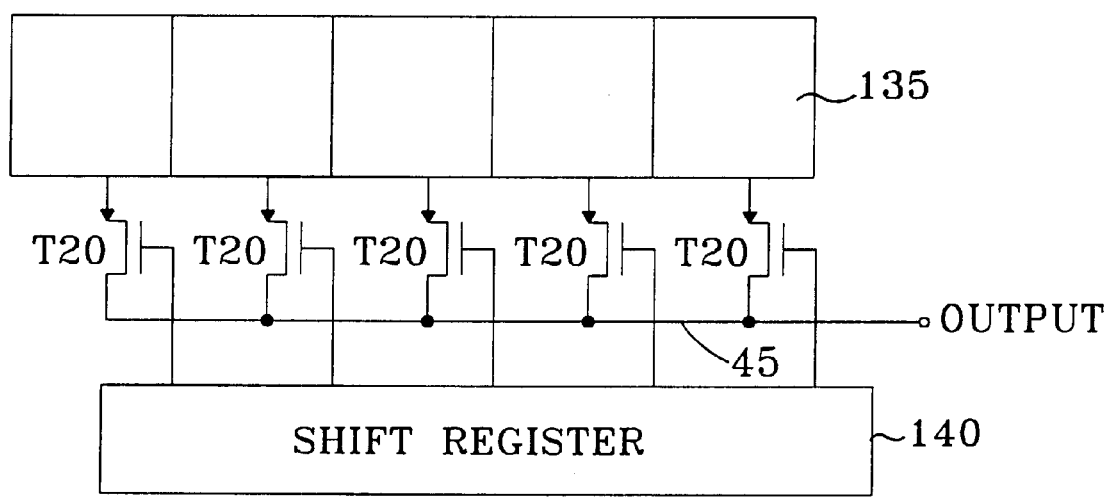
FIG. 8 is a drawing depicting the configuration of the multi-quantum well infrared photo-detector in accordance with the third embodiment of the present invention.
Figure 8B:
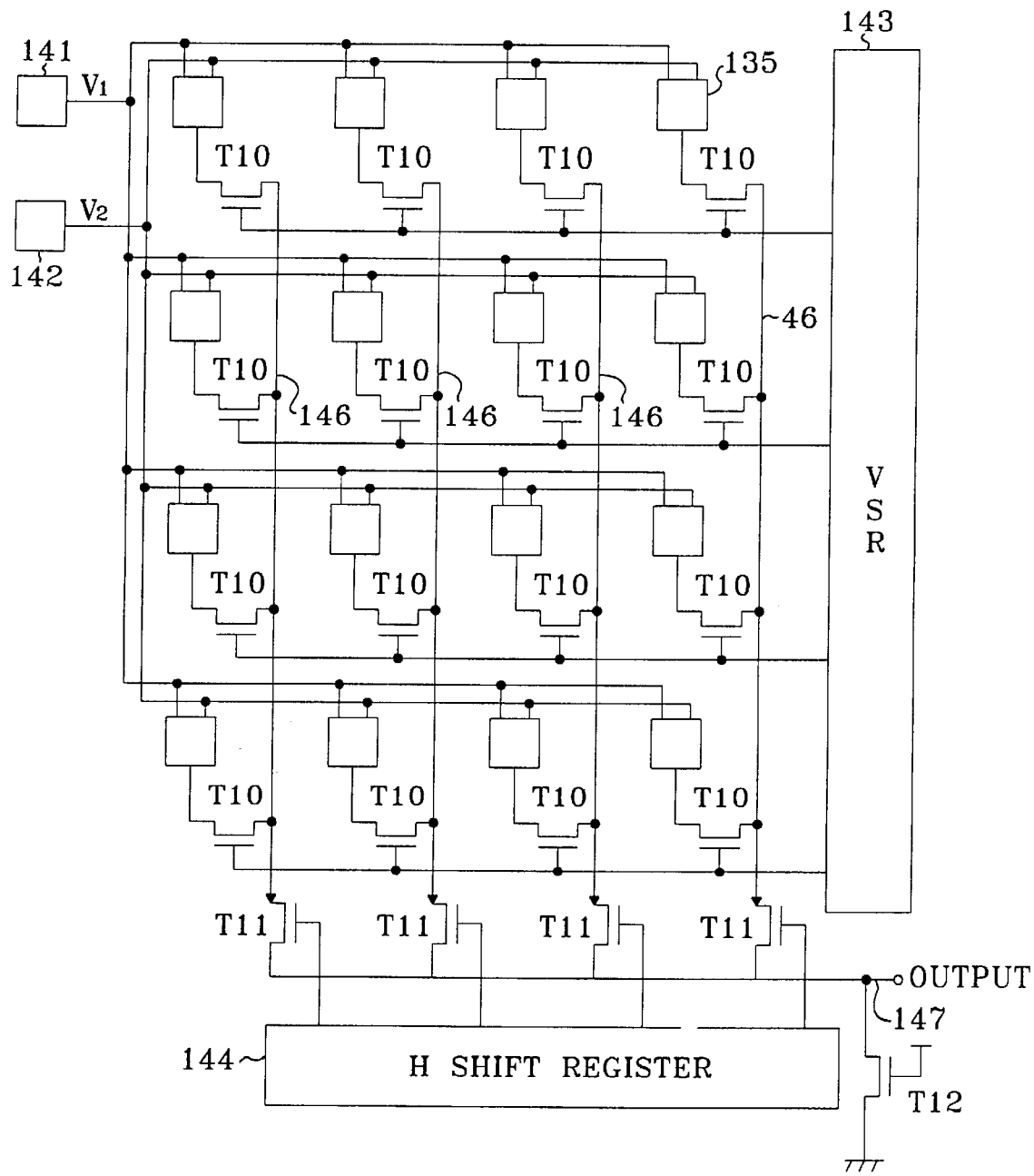

FIG. 8 is a drawing depicting the configuration of the multi-quantum well infrared photo-detector in accordance with the third embodiment of the present invention, where FIG. 8A depicts an example when the unit cell 135 of the multi-quantum well infrared sensor is configured to be a one-dimensional array, and FIG. 8B depicts an example when the unit cell 135 is configured to be a two-dimensional array.

In the case of the one-dimensional array in FIG. 8A, the multi-quantum well infrared photo-detector of the second embodiment shown in FIG. 7, for example, is used for the unit cell 135. And the signal voltage which is output from the unit cell 135 is output to the common bus wiring 145 via the switching transistor T20 which is sequentially driven by the shift register 140.

For the two-dimensional array in FIG. 8B, the multi-quantum well infrared photo-detector of the first embodiment shown in FIG. 6, for example, is used for the unit cells 135 which are arranged in four columns and four rows. The signal voltage output from the unit cells 135 is output to the vertical bus wiring 146 via the switching transistor T10 which is driven by the vertical shift register 143, and the signals of the vertical bus wiring 146 are output to the output bus wiring 147 via the switching transistor T11 which is driven by the horizontal shift register 144, so as to multiplex signals. The bias voltages V1 and V2 are supplied from the power supplies 141 and 142, and the transistor T12 is a current source to be a load.

FIG. 9 is an explanatory drawing of a current subtraction circuit added to the multi-quantum well infrared photo-detector of an embodiment of the present invention. When infrared is received, detection current I1 and I2 flow in the multi-quantum well layers MQW1 and MQW2, but even when infrared is not received, a dark current generated by thermal excitation flows. So in the case of the multi-quantum well infrared photo-detector of the present embodiment, the current subtraction circuit is added to cancel the offset of the dark current, and the detection dynamic range is increased.

Figure 9A:
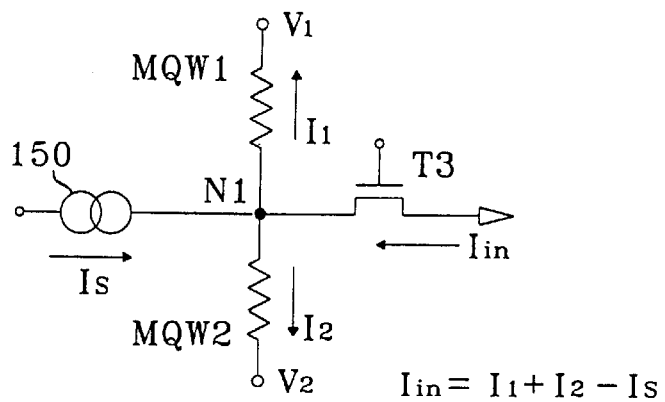
FIG. 9 is an explanatory drawing of a current subtraction circuit in accordance with an embodiment of the present invention.

FIG. 9A is a drawing depicting a theoretical configuration of the current subtraction circuit of the present embodiment, where current Is, which is equal to the dark current, is supplied to the connecting point N1 between the multi-quantum well layers MQW1 and MQW2 from the current source 150. Therefore the signal current Iin, which flows in the transistor T3, is the sum of currents I1 and I2 minus the current Is, and can cancel the offset of the dark current from the signal current Iin.

Figure 9B:
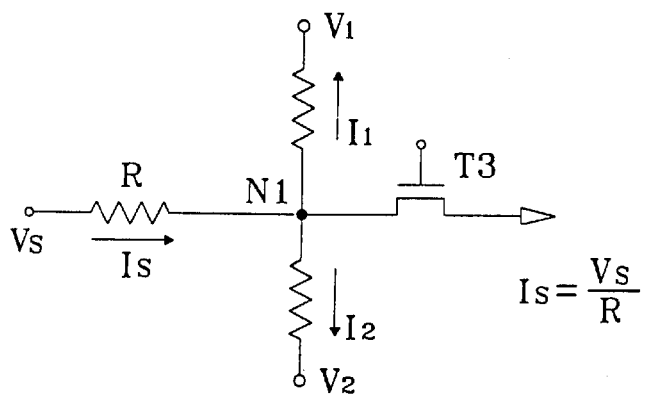
Figure 9C:
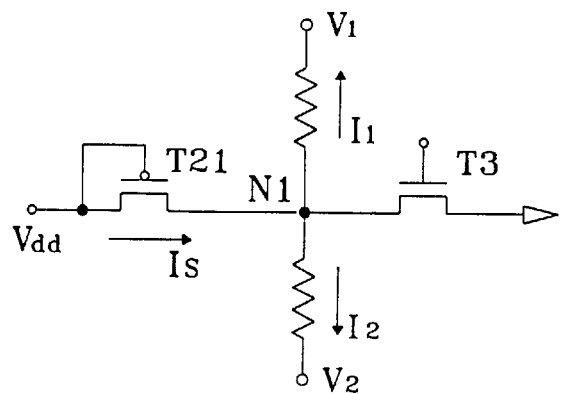

FIG. 9B depicts the current subtraction circuit comprised of a resistor, where the resistor R connected to the power supply Vs is connected to the node N1, so as to supply current Is=Vs/R, which is equal to the dark current. FIG. 9C depicts the current subtraction circuit which is comprised of the MOS transistor, where p-type MOS transistor T21 connected to the power supply Vdd is connected to the node N1, and dark current is supplied by the saturated current Is.

Figure 9D:
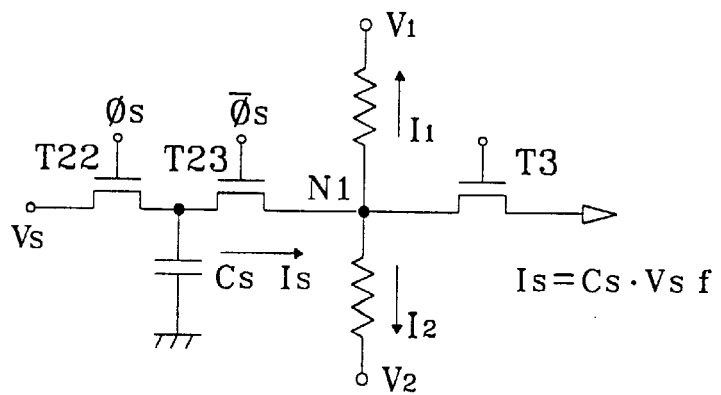

FIG. 9D depicts the current subtraction circuit which is comprised of a switch and capacitor, where the switched capacitor circuit comprised of the switch transistors T22 and T23 and the capacitor Cs is connected to the node N1, so as to supply current Is equal to the dark current. In other words, the switch transistor T22 conducts by the timing signal Φs and charges the capacitor Cs with the current from the power supply Vs. The switch transistor T23 conducts by the inversion timing signal/Φs and supplies the discharge current from the capacitor Cs to the node N1. This discharge current Is is equal to the dark current. When the frequency of the timing signal Φs is f, the electric charge to be charged in the capacitor Cs is Qs=Cs·Vs, therefore the discharge current Is=Cs·Vs·f.

FIG. 10 is an explanatory drawing of signal read mode in the multi-quantum well infrared photo-detector of the present embodiment. In accordance with the present embodiment, the detection current in each multi-quantum well layer can be read individually without generating cross-talk by controlling the bias voltage of each multi-quantum well layer, and the sum and difference of each detection current can also be read directly, therefore the configuration of the multi-quantum well infrared photo-detector can be simplified.

FIG. 10A is the case when the current I1 in the multi-quantum well layer MQW1 is read, where the voltage V1=−2[V] is applied to the electrode 117, and 0[V] is applied to the electrode 119. In this case, the node N1 is fixed roughly to 0[V] as mentioned above, and bias voltage is applied only to the multi-quantum well layer MQW1, therefore the current Iin=I1 flows in the transistor T3, and only multi-quantum well layer MQW1 can be read.

FIG. 10B is the case when the current I2 in the multi-quantum well layer MQW2 is read, where 0[V] is applied to the electrode 117, and voltage V2=−2[V] is applied to the electrode 119. In this case, current Iin=I2 flows in the transistor T3, and only multi-quantum well layer MQW2 can be read.

FIG. 10C is the case when the sum of the current I1 in the multi-quantum well layer MQW1 and the current I2 in the multi-quantum well layer MQW2 is read, where the voltage V1=−2[V] is applied to the electrode 117, and voltage V2=−2[V] is applied to the electrode 119. In this case as well, the voltage of the node N1 is fixed roughly to 0[V], so the bias voltage is applied to both the multi-quantum well layer MQW1 and the multi-quantum well layer MQW2, the current Iin=I1+I2 flows in the transistor T3, and the sum signal of the multi-quantum well layer MQW1 and the multi-quantum well layer MQW2 can be read.

FIG. 10D is the case when the difference between the current I1 in the multi-quantum well layer MQW1 and the current I2 in the multi-quantum well layer MQW2 is read, where voltage V1=−2[V] is applied to the electrode 117 and voltage V2=+2[V] is applied to the electrode 119. In this case as well, the voltage of the node N1 is fixed roughly to 0[V], so bias voltage with reversed polarity is applied to the multi-quantum well layer MQW1 and the multi-quantum well layer MQW2, the current Iin=I1−I2 flows in the transistor T3, and the difference signal between the multi-quantum well layer MQW1 and the multi-quantum well layer MQW2 can be read.

Figures 11A, 11B, 12:
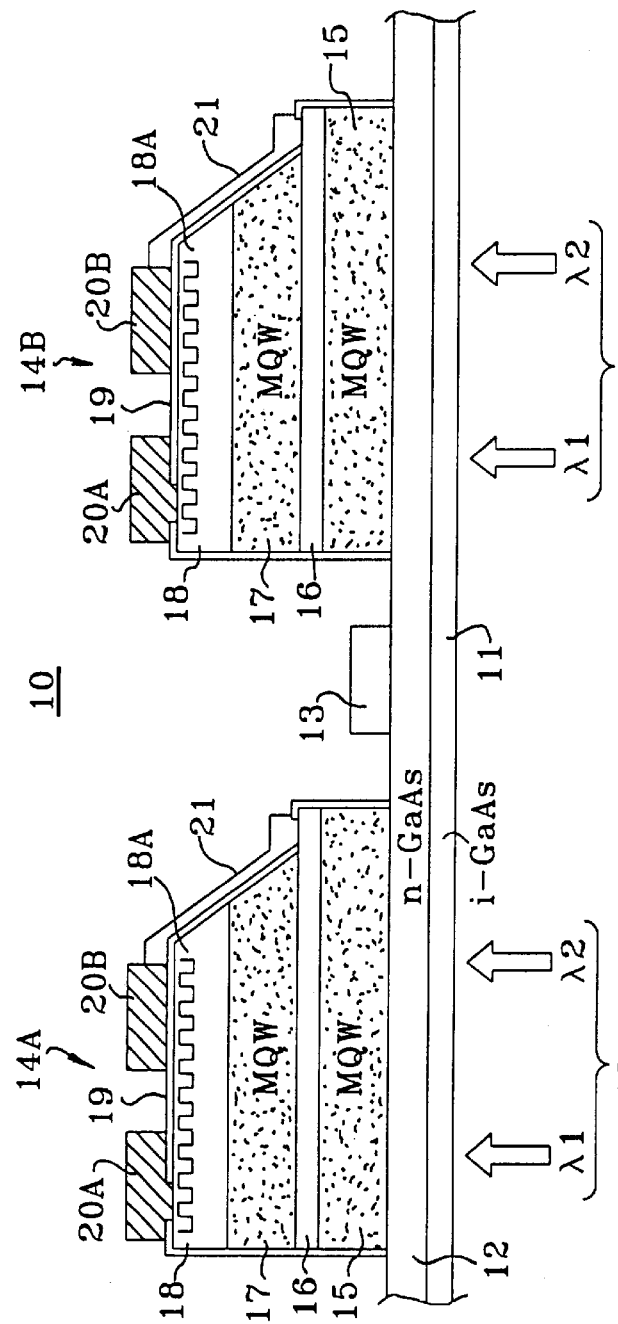
FIG. 12 is a drawing depicting a configuration of a conventional infrared image sensor using a dual wavelength photo-sensor.

FIG. 11 is an explanatory drawing depicting the multi-quantum well infrared photo-detector in accordance with the embodiment of the present invention. In order to detect a target 151 at a distance, as shown in FIG. 11A, a search is executed in the sum signal mode. Since signals with two wavelength ranges are added in the sum signal mode, a high S/N ratio can be implemented, which makes it possible to track target 151 at a distance.

When the target 151 approaches and signal intensity increases, as shown in FIG. 11B, it becomes possible to obtain signals in respective wavelength ranges independently, and to identify/classify the target 151 by these features acquired as the result of comparing the respective signals. When the target 151 approaches even closer, it becomes possible to detect the difference of signals having respective wavelength ranges in the difference signal mode, and to recognize the detailed structure of the target 151.

As described above, according to the present invention, signals from a plurality of detecting wavelength ranges can be independently read without generating cross-talk even if the respective detecting wavelength ranges are close to each other, and the sum signals and difference signals of the respective signals can be read directly.

Now the specific structure and manufacturing method for the infrared image sensor of the present invention will be described.

FIG. 12 shows a configuration of a conventional infrared image sensor 10 which can operate for two wavelengths, $\lambda 1$ and $\lambda 2$. According to FIG. 12, a bottom contact layer 12 comprised of an n-type GaAs is epitaxially grown on a support layer 11 comprised of semi-insulating GaAs, and a common electrode 13 is ohmically formed on the bottom contact layer 12.

On the bottom contact layer 12, a photo-sensor 14A is formed on a region 12A at one side of the common electrode 13, and a photo-sensor 14B, which actually has the same configuration as the above mentioned photo-sensor 14A, is formed on the other region 12B. At this time, the photo-sensor 14A and the photo-sensor 14B form picture elements respectively in a sensor array constituting the infrared image sensor 10.

The above photo-sensors 14A and 14B both comprise a bottom multi-quantum well structure 15 comprised of epitaxial layers formed on the contact layer 12, an intermediate contact layer 16 comprised of an n-type GaAs, which is epitaxially grown on the multi-quantum well structure 15, a top multi-quantum well structure 17, which is epitaxially grown on the intermediate contact layer 16, and a top contact layer 18 comprised of an n-type GaAs, which is epitaxially grown on the top multi-quantum well structure 17, and the top face and side wall faces of the above layered structure are covered with a thin insulating film 19. On the portion covering the top contact layer 18 of the insulating film 19, the ohmic electrodes 20A and 20B are formed. Of these ohmic electrodes, the electrode 20A ohmically contacts the top contact layer 18 via a contact hole formed in the insulating film 19, and the electrode 20B ohmically contacts the intermediate contact layer 16 via a conductor pattern 21 which extends on the insulating film 19.

The GaAs support layer 11 is actually epitaxially grown on the GaAs substrate, which is not illustrated here, and the GaAs substrate is selectively removed by wet etching using an appropriate etching stopper film after the structure shown in FIG. 12 is formed. In the structure shown in FIG. 12, the light beams with wavelengths $\lambda 1$ and $\lambda 2$ enter from the bottom of the photo-sensors 14A and 14B via the support layer 11, where the light beam component with wavelength $\lambda 1$ is detected by a bottom MQW structure 15, and the light beam component with wavelength $\lambda 2$ is detected by a top MQW structure 17. The bottom MQW structure 15 and the top MQW structure 17 both have a structure where a GaAs quantum well layer and an AlGaAs barrier layer are alternately layered, but in the case of the bottom MQW structure 15, the thickness of the quantum well layer of the MQW structure and the Al composition of the barrier layer are set such that the quantum level formed in the MQW structure 15 resonates with the light beam component having wavelength $\lambda 1$, and in the case of the top MQW structure 17, the thickness of the quantum well layer of the MQW structure and the Al composition of the barrier layer are set such that the quantum level formed in the MQW structure 17 resonates with the light beam component having wavelength $\lambda 2$. Also, to promote an optical interaction between the light beam roughly vertically entering the support layer 11 and the quantum well layer, a diffraction grating 18A is formed in the top contact layer 18.

Figure 13:
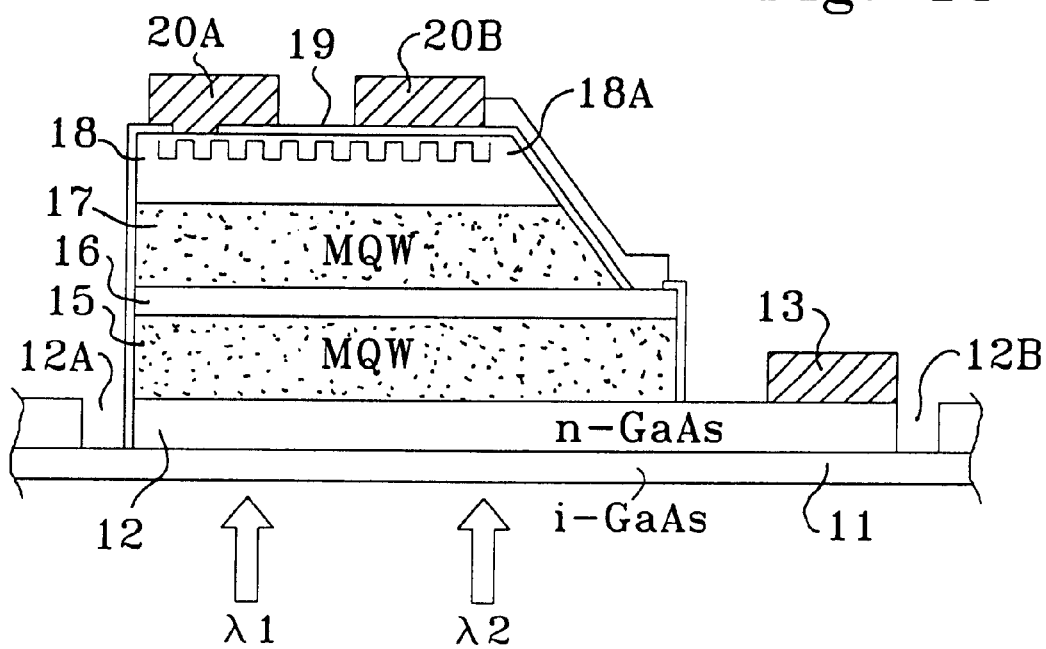
FIG. 13 is a drawing (I) depicting a principle of the present invention.
Figure 14:
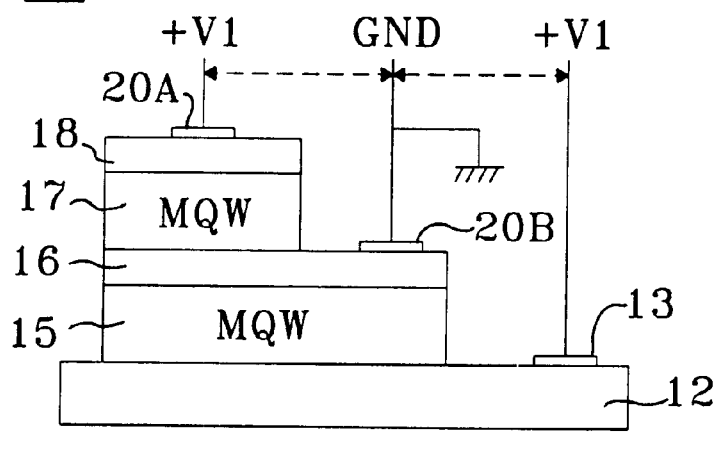
FIG. 14 is a drawing (II) depicting a principle of the present invention.

FIG. 13 and FIG. 14 show a theoretical configuration of the photo-sensor of the present invention. In these drawings, parts described earlier are denoted with the same reference numerals, for which explanation is omitted.

According to FIG. 13, the photo-sensor 14 of the present embodiment has a configuration essentially the same as the photo-sensors 14A and 14B shown in FIG. 12, but the difference is that the bottom contact layer 12 comprised of an n-type GaAs is isolated by the element isolation grooves 12A and 12B, which expose the support layer 11 comprised of semi-insulating GaAs under the bottom contact layer 12. In other words, in the present embodiment, the photo-sensor 14 is formed to be electrically isolated from the adjacent photo-sensor on the support layer 11.

FIG. 14 shows an operation of the photo-sensor 14 in FIG. 13. In the depiction of FIG. 14, however, the photo-sensor 14 in FIG. 13 is simplified.

According to FIG. 14, in the photo-sensor 14 of the present embodiment, the bottom contact layer 12 is formed to be isolated by the element isolation grooves 12A and 12B, and is not shared with other photo-sensors. Therefore the photo-sensor 14 can be configured such that only the photo-electrical current generated in the bottom ohmic electrode 13 on the bottom contact layer 12 by the bottom MQW structure 15 can be output. In the configuration of FIG. 14, the intermediate contact layer 16 is shared by the bottom MQW structure 15 and the top MQW structure 17, and the intermediate contact layer 16 is grounded by the ohmic electrode 20B. Also a +V1 drive voltage is applied to the ohmic electrode 13 and the ohmic electrode 20A.

Figure 19:
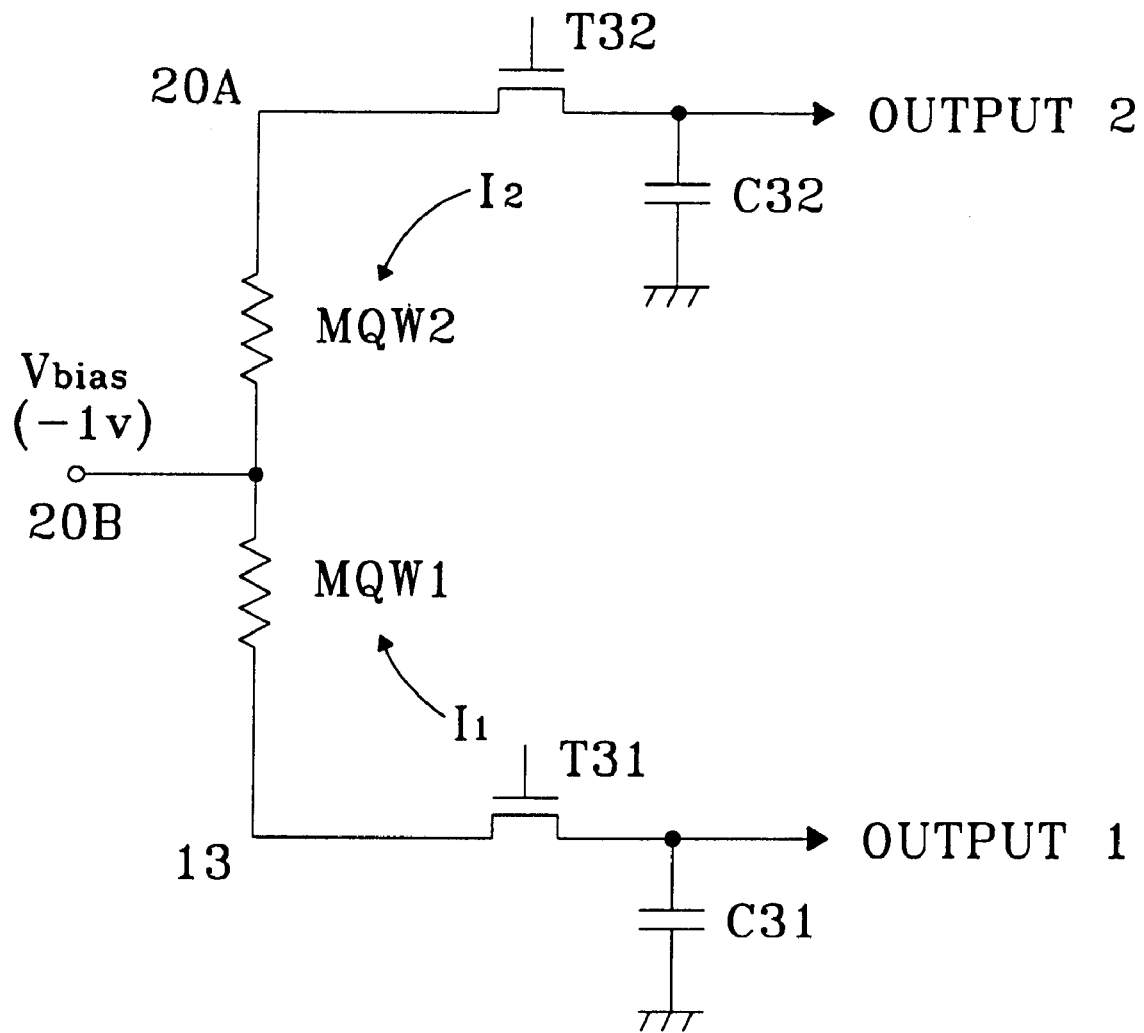
FIG. 19 is a read-out circuit diagram of the photo-sensor shown in FIG. 14.

FIG. 19 is a read-out circuit diagram of the photo-sensor shown in FIG. 13. The first MQW1 is connected to a capacitor C31 via a sampling transistor T31. The second MQW2 is connected to a capacitor C32 via a sampling transistor T32. Further, the common electrode 20B of MQW1, MQW2 is connected to a bias voltage $V_{bias}$. In this circuit, first both of the capacitors C31, C32 are charged up. Next, the charge of the capacitors C31, C32 are discharged by the currents of MQW1, MQW2 respectively while conducting the transistors T31, T32 within a certain period. The remaining voltages of the capacitors C31, C32 are read out to the outputs 1, 2 as the detected value.

According to such a configuration, the corresponding photo-electrical current can be output respectively from the electrodes 20A and 13 independently without generating mutual interference, even if lights having wavelengths λ1 and λ2 enter the MQW structures 15 and 17. Whereas in a conventional photo-sensor 14A shown in FIG. 12, the bottom contact layer 12 is shared with the adjacent photo-sensor 14B, so only the photo-electric current generated by the MQW structure 15 of the photo-sensor 14A cannot be output from the ohmic electrode 13.

Figure 15A:
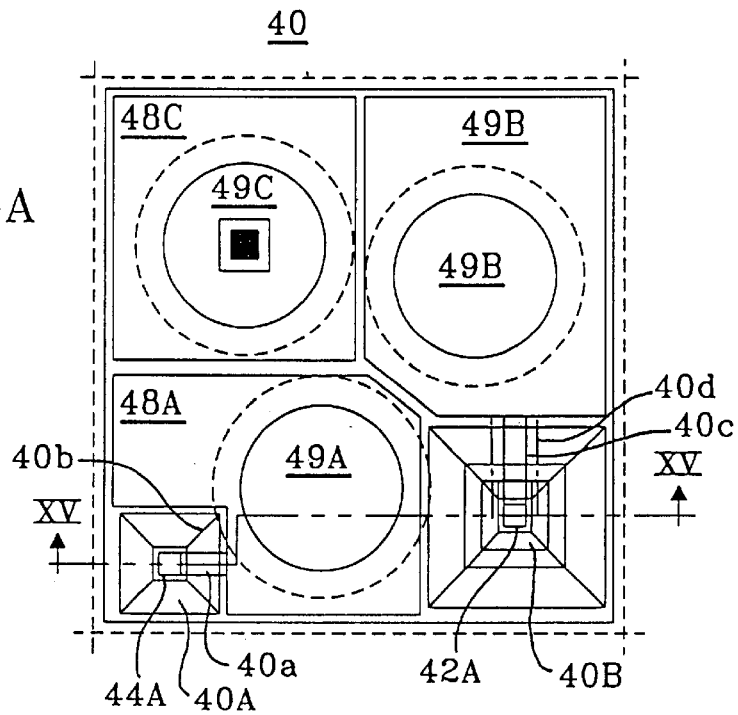
FIGS. 15A and 15B are drawings depicting a configuration of a photo-sensor in accordance with an embodiment of the present invention.
Figure 15B:
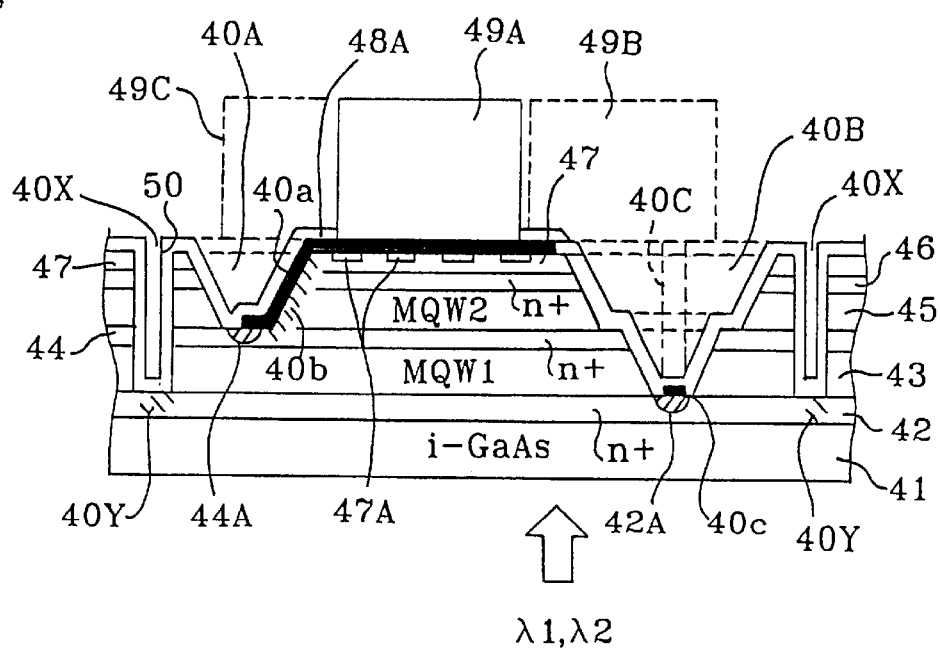

FIG. 15A is a plan view depicting the configuration of the photo-sensor 40 in accordance with an embodiment of the present invention, and FIG. 15B is an XV—XV cross-sectional view of the plan view shown in FIG. 15A. FIG. 15B is a cross-sectional view when viewing the XV—XV cross-section in FIG. 15A from the arrow direction, and a portion, which could be seen through the cross-section, is denoted by a broken line.

According to the cross-sectional view in FIG. 15B, the bottom contact layer 42 comprised of an n+ type GaAs is epitaxially grown on the support layer 41 comprised of a non-doped GaAs, and the MQW structure 43, which will be explained later with reference to FIG. 16, is formed on the bottom contact layer 42.

The second contact layer 44 comprised of an n+ type GaAs is formed on the MQW structure 43, and another MQW structure 45 is formed on the second contact layer 44.

The third contact layer 46 comprised of an n+ type GaAs is formed on the other MQW structure 45, and the contact layer 46 is covered with a high resistance optically coupled layer 47 comprised of non-doped GaAs. A diffraction grating 47A is formed in the optically coupled layer 47. The MQW structures 43 and 45 absorb infrared having a respective wavelength in the 6–9 μm band in the present embodiment, but the present invention is not restricted to such specific wavelengths.

The photo-sensor 40 in accordance with the present embodiment has a rectangular shape, as shown in the plan view in FIG. 15A, and is enclosed with a deep element isolation groove 40X, as shown in the cross-sectional view in FIG. 15B. The element isolation groove 40X encloses the photo-sensor 40 without disconnection, and in this example, the first contact layer 42 is exposed at the base of the element isolation groove 40X. On the portion of the first contact layer 42 corresponding to the base of the element isolation groove 40X, a high resistance element isolation region 40Y is formed along with the element isolation groove 40X by O+ ion implantation. In the plan view in FIG. 15A, the photo-sensor 40 is electrically isolated from an adjacent photo-sensor having a similar configuration, by the element isolation groove 40X and the high resistance region 40Y at the base.

Also, as the cross-sectional view in FIG. 15B shows, in the semiconductor layer constituting the photo-sensor 40, the first concave section 40A, where the second contact layer 44 is exposed, is formed, penetrating the semiconductor layers 47–45, and the second concave section 40B, where the first contact layer 42 is exposed, is formed penetrating the semiconductor layers 47–43. At this time, an ohmic electrode 44A, having an AuGe/Ni/Au layered structure, is formed in the contact layer 44 which is exposed at the base of the concave section 40A, and an ohmic electrode 42A is formed in the same way in the contact layer 42, which is exposed by the concave section 40B.

Also, as the plan view in FIG. 15A shows, electrode pads 48A, 48B and 48C having a Ti/Au layered structure are formed in isolation from each other on the high resistance optically coupled layer 47, and the electrode pad 48A is electrically connected with the n+ type contact layer 44, which is exposed at the base of the concave section 40A by a conductor pattern 40a which extends on the side wall faces of the concave section 40A. Since the conductor pattern 40a extends on the side walls of the concave section 40A, the high resistance region 40b is formed on the portion where the conductor pattern 40a is formed out of the side wall faces by O+ ion implantation.

In the same way, the electrode pad 48B is electrically connected with the n+ type contact layer 42, which is exposed at the base of the concave section 40B by the conductor pattern 40c which extends on the side wall faces of the concave section 40B. See the plan view in FIG. 15A. Since the conductor pattern 40c is formed on the side wall faces of the concave section 40B, a high resistance region 40d is formed in the portion of the side wall faces where the conductor pattern 40c is formed by O+ ion implantation.

The electrode pad 48c, on the other hand, contacts the contact layer 46 below via the contact hole 47B (see FIG. 15A) formed in the optically coupled layer 47. The electrode pads 48A–48C also function as mirrors for reflecting incoming light on the optically coupled layer 47. On the electrode pads 48A–48C, electrode bumps 49A–49C comprised of In are formed respectively, and exposed portions of this structure are covered with insulating film 50, such as SiON.

A large number of photo-sensors 40 which have such a structure are arrayed on the GaAs support layer 41 to create an infrared image sensor, where the bump electrodes 49A–49C of each photo-sensor 40 are formed essentially on the same plane, therefore an infrared image sensor created in this manner can be easily mounted on a printed circuit board or on an integrated circuit for driving the photo-sensor array by surface mount technology. The GaAs support layer 41, which inter-connects the photo-sensors 40, is very thin, as explained later, and does not have essential mechanical strength, but the infrared image sensor is mechanically stable since each photo-sensor 40 is mounted on the above mentioned printed circuit board or integrated circuit which has rigidity. Since the support layer 41 is thin, absorption of the light beam by the support layer 41 when the light beam enters the MQW layer 43 or 45 through the support layer 41 can be effectively decreased.

The non-doped GaAs support layer 41 is actually formed on the GaAs substrate, which is not illustrated in FIGS. 15A and 15B, as an epitaxial layer, but the substrate has been removed by etching in the completed photo-sensor 40 shown in FIGS. 15A and 15B. The manufacturing steps of the photo-sensor 40 shown in FIGS. 15A and 15B will be explained below.

To manufacture the photo-sensor 40 or the infrared image sensor where many of the photo-sensors 40 are arrayed, the semiconductor layer structure shown in FIG. 16 is formed first. According to FIG. 16, the GaAs support layer 41 is epitaxially grown at an approximately 900 nm thickness on the (100) face of the semi-insulating GaAs substrate 61, sandwiching approximately 100 nm of the GaAs buffer layer 62 and an etching stopper layer 63 comprised of a non-doped InGaP, and the bottom contact layer 42 comprised of n+ type GaAs is epitaxially grown, typically to a 100 nm thickness, on the GaAs support layer 41.

On the bottom contact layer 42, an etching stopper layer 64 comprised of n-type InGaP and a buffer layer 65 comprised of n-type GaAs are epitaxially grown at the respective thickness, and the MQW structure 43 is formed on the buffer layer 65 which was formed in this way. More specifically, the MQW structure 43 has a configuration where the non-doped AlGaAs barrier layer, which composition is $Al_{0.3}Ga_{0.7}As$ and thickness is 40 nm and the non-doped GaAs quantum well layer which thickness is 4 nm are epitaxially grown repeatedly for 20 times, and in the quantum well layer, a quantum level corresponding to a 7 $\mu$m wavelength is generated for electrons. This means that if light with the above mentioned wavelength enters the MQW structure 43 under an appropriate bias voltage, electrons in the quantum well are excited and light is absorbed. The excited electrons generate photoelectric current which indicates the detection of incoming light.

On the MQW structure 43, the second contact layer 44 comprised of the above mentioned n-type GaAs is epitaxially grown at an approximately 400 nm thickness, and on the contact layer 44, the quantum well layer 45 is formed by epitaxially growing the non-doped AlGaAs barrier layer which composition is $Al_{0.24}Ga_{0.76}As$ and thickness is 40 nm, and the non-doped GaAs quantum well layer which thickness is 5 nm repeatedly for 20 times via the epitaxially grown InGaP etching stopper layer 66 and the epitaxially grown GaAs buffer layer 67 which thickness is 50 nm. In the quantum well layer of the MQW structure 45, a quantum level corresponding to 9 $\mu$m is generated for the electrons. In the MQW structure 45 as well, just like the case of the MQW structure 43, electrons in the quantum well are excited and light absorption is generated responding to the entering of incoming light having a wavelength of 9 $\mu$m, and this generates photoelectric current.

On the MQW structure 45, the top contact layer 46 comprised of an n-type GaAs is epitaxially grown at an approximately 400 nm thickness, and on the top contact layer 46, the non-doped GaAs high resistance layer 69, which thickness is approximately 500 nm, is epitaxially grown via the non-doped AlGaAs etching stopper layer 68 which composition is $Al_{0.3}Ga_{0.7}As$. On the GaAs high resistance layer 69, the non-doped AlGaAs etching stopper layer 70, which composition is $Al_{0.3}Ga_{0.7}As$, is formed, and on the etching stopper layer 70, the optically coupled layer 47 is formed, typically to be 700 nm thickness, by epitaxially growing the non-doped GaAs film.

In the layer structure in FIG. 16, the n-type contact layers 42, 44 and 46, the n-type GaAs buffer layer 65 and 67, and the n-type InGaP etching stopper layer 64 and 66 are doped, typically to a $5 \times 10^{17}$ $cm^{-3}$ carrier density.

FIG. 17A–FIG. 18J show the steps of forming the photo-sensor 40 shown in FIGS. 15A and 15B, starting from the layer structure in FIG. 16. FIG. 17A–FIG. 18J are simplified, and the entire semiconductor layer in FIG. 16 is not shown therein.

Figure 17A:
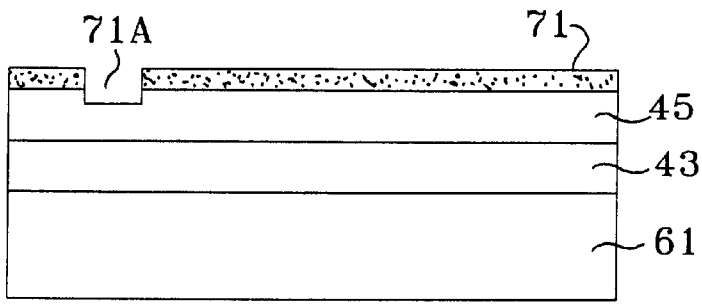
FIGS. 17A–17E are drawings depicting manufacturing steps (part 1) of the photo-sensor in FIG. 15.
Figure 17B:
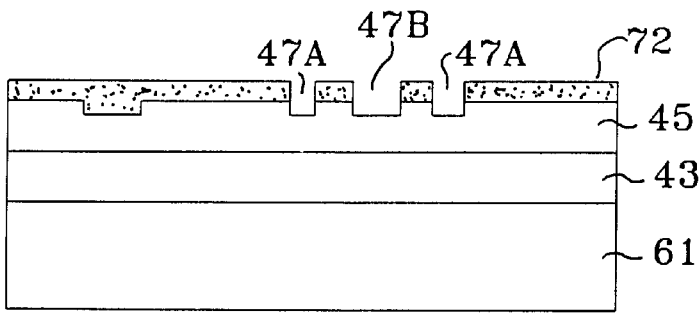

According to FIG. 17A, a resist pattern 71 is formed on the GaAs optically coupled layer 47, and an alignment mark is formed in the optically coupled layer 47 corresponding to a resist opening part 71A. Then, in the step in FIG. 17B, the resist pattern 71 is removed and a diffraction grating pattern 47A is formed in the optically coupled layer 47 by patterning the optically coupled layer 47 by dry etching using a new resist pattern 72 as a mask. In FIG. 17B, only a single groove is illustrated for the diffraction grating pattern 47A to simplify explanation, but actually the above groove 47A is repeatedly formed in the optically coupled layer 47. When the groove 47A is formed by dry etching, the AlGaAs layer 70 in FIG. 16 functions as an etching stopper.

In the step in FIG. 17B, not only the diffraction grating 47A but also a contact hole 47B for exposing the top contact layer 46 is formed in the optically coupled layer 47 by dry etching using the resist pattern 72. In this step in FIG. 17B, the contact hole 47B has not reached the top contact layer 46. After forming the diffraction grating 47A and the contact hole 47B, the exposed AlGaAs layer 70 is removed by wet etching.

Figure 17C:
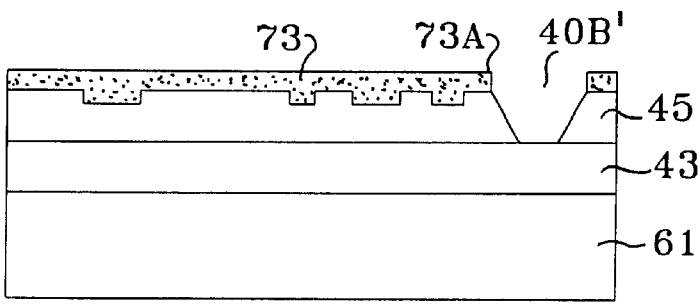
Figure 17D:
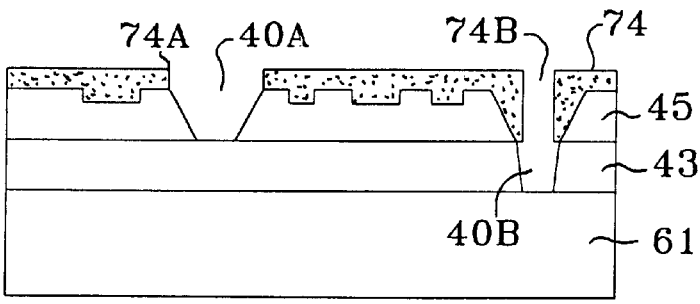

Then in the step in FIG. 17C, a resist pattern 73, which has an opening part 73A, is formed on the structure in FIG. 17B, and the portion from the optically coupled layer 47 to the GaAs buffer layer 67 is wet etched with the resist pattern 73 as a mask, using the InGaP layer 66 as an etching stopper, so that the concave section 40B' corresponding to the concave section 40B shown in FIGS. 15A and 15B is formed in the MQW structure 45.

After removing the resist pattern 73 and the exposed InGaP layer 66, wet etching is executed using a resist pattern 74 which has the opening part 74B corresponding to the concave section 40B' and the opening part 74A corresponding to the concave section 40A in FIGS. 15A and 15B as a mask, so that the concave section 40A is formed in the MQW structure 45, and the concave section 40B is formed in the MQW structure 43. At this time, the InGaP layer 66 is used as an etching stopper to form the concave section 40A, and the InGaP layer 64 is used as an etching stopper to form the concave section 40B.

Figure 17E:
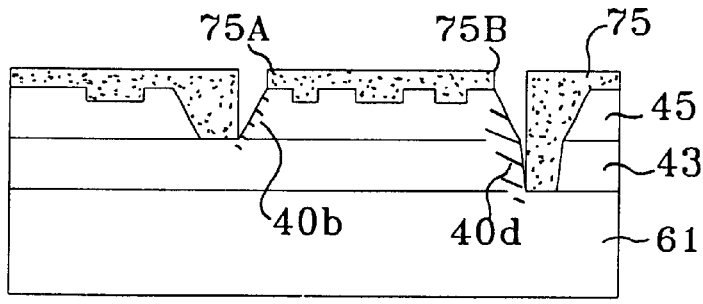

Then in the step in FIG. 17E, the resist pattern 74 is removed, and a resist pattern 75, which has an opening part 75A corresponding to a part of the concave section 40A and an opening part 75B corresponding to a part of the concave section 40B, is formed. Also by implanting O+ ions using the resist pattern 75 as a mask, the high resistance region 40b is formed on the side wall faces of the concave section 40A, and the high resistance region 40d is formed on the side wall faces of the concave section 40B.

Figure 18F:
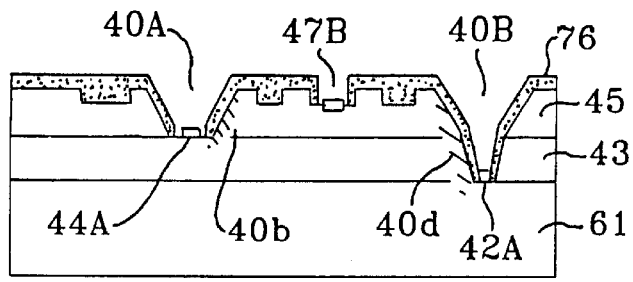
FIGS. 18F–18J are drawings depicting manufacturing steps (part 2) of the photo-sensor in FIG. 15.

Then in the step in FIG. 18F, dry etching is executed using a resist pattern, not illustrated, which has an opening part corresponding to the contact hole 47B, so as to expose the top contact layer 68 in the contact hole 47B. After depositing a conductive film 76 having a AuGe/Ni/Au structure on the resist pattern, the conductive film 76 is removed by the lift-off method so as to form the ohmic electrode 44A or 42A in the base of the concave sections 40A and 40B. A similar ohmic electrode is also formed in the contact hole 47B.

Figure 18G:
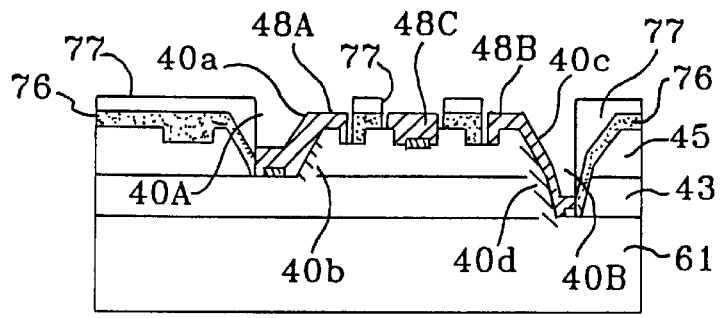

Then in the step in FIG. 18G, high reflectance conductive patterns 40a and 40c having an Au/Ti structure are formed on the side wall faces of the concave sections 40A and 40B respectively by the lift-off method using the resist pattern 77. The conductive pattern 40a forms a part of the ohmic electrode pad 48A, and in the same way, the conductive pattern 40c forms a part of the ohmic electrode pad 48B. An ohmic electrode pad 48C, which contacts the top contact layer 46, is formed corresponding to the contact hole 47B.

Figure 18H:
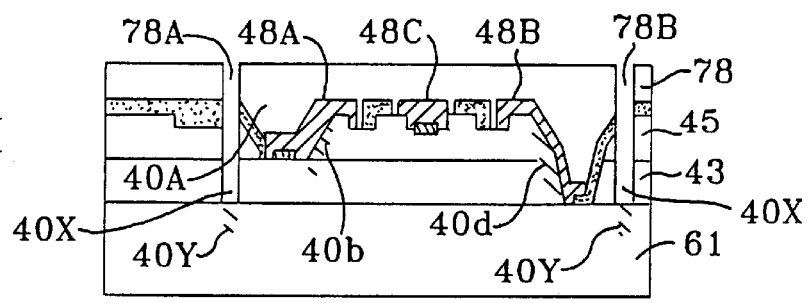

Then in the step in FIG. 18H, the resist pattern 77 is removed and a resist pattern 78 having opening parts 78A and 78B corresponding to the element isolation groove 40X is formed instead. Then using the resist pattern 78 as a mask, dry etching for exposing the InGaP layer 65 and wet etching for removing the InGaP are repeatedly executed for the semiconductive layer, so as to form the element isolation groove 40X. After forming the element isolation groove 40X, the InGaP layer 65, which is exposed in the base of the groove 40X, is removed by wet etching, and O+ ions are implanted using the same resist pattern 78 as a mask, so that a high resistance element isolated region 40Y is formed in the bottom contact layer 42, which is exposed at the base of the groove 40X.

Figure 18I:
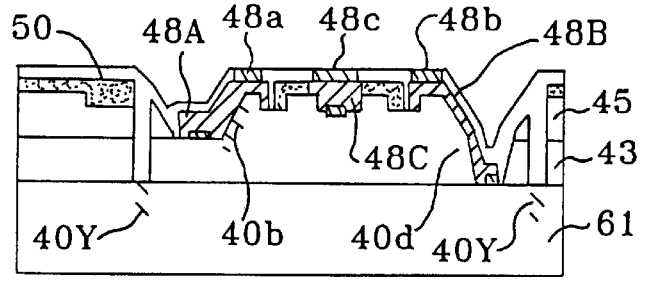

Then in the step in FIG. 18I, the resist pattern 78 is removed and the SiON insulating film 50 is uniformly deposited on the structure in FIG. 18H. After the insulating film 50 is patterned to expose the ohmic electrode pads 48A–48C, Ti/Au films 48a–48c are formed respectively on the exposed ohmic electrode pads 48A–48C.

Figure 18J:
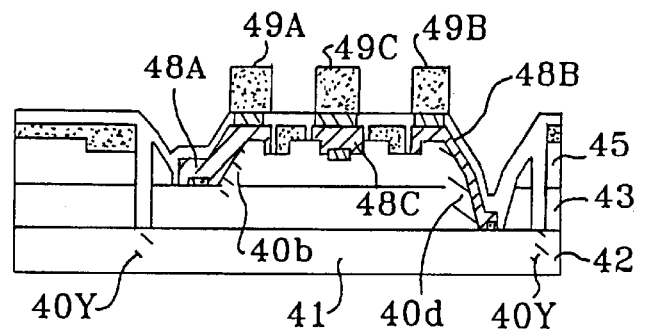

Then in the step in FIG. 18J, the In electrode bumps 49A–49C are formed respectively on the ohmic electrode pads 48A–48C by the lift-off method, by which the infrared photo-sensor 40 is formed. In this process, many infrared photo-sensors 40 are formed on the same GaAs substrate 61, so as to form the infrared image sensor.

The infrared image sensor created in this way is mounted on the substrate having rigidity using the In electrode pads 49A–49C, and in this state, the GaAs substrate 61 is removed by wet etching using the GaInP layer 63 as an etching stopper. The GaInP layer 63 is removed by another etchant, then the photo-sensor 40, where the GaAs support layer 41 is exposed at the base constituting a light receiving face, or the infrared image sensor where the photo-sensors 40 are one-dimensionally or two-dimensionally arrayed, can be obtained with the configuration shown in FIGS. 15A and 15B.

In the above configuration of the present embodiment, it is possible to form the element isolation groove so as to reach the support layer 41, omitting forming the high resistance region 40Y instead. In this case, the InGaP etching stopper layer 64 exposed at the base of the groove 40X is removed by wet etching, then dry etching is executed on the GaAs contact layer 42.

In the present embodiment, the conductive patterns 40a and 40c extending on the side wall faces of the concave section 40A or 40B are insulated by forming the high resistance ranges 40b or 40d by implanting impurity element ions deep into the side wall faces, but the insulation may also be created by forming an insulating film, such as $SiO_2$, SiN or SiON.

For the photo-sensor 40 in accordance with the present embodiment, the surface may be planarized by coating polyimide film in the step in FIG. 18I. For such planarization, wiring from the contact layer 42 or 44 may be led onto the planarized film where electrode pads are formed using such a wiring pattern such as Al.

The photo-sensor 40 or the image sensor in accordance with the present embodiment is not limited to the photo-detection for infrared wavelengths, but can be applied to photo-detection for visible light wavelengths. For the photo-sensor 40, a structure other than the MQW structure, or a semiconductive layer can be used for absorbing light and generating photo-electric current.

The photo-sensor in accordance with the present embodiment is configured so as to detect only two wavelengths of light, but the present embodiment can be modified so as to detect three or more wavelengths of light by combining the photo-sensors or increasing the layer structure.

According to the present invention, in the photo-sensor having a configuration where two active layers are layered, the contact layer in between is used as a common electrode layer, so that the active layers corresponding to two different wavelengths can be driven simultaneously or switched. This structure also prevents the mixing of photoelectric currents corresponding to the two wavelengths. Also, the photo-sensor is separated from another adjacent photo-sensor on the same support layer by the element isolation structure, so as to effectively prevent interference with the adjacent photo-sensor. The photo-sensor or the image sensor in accordance with the present invention is suitable for mounting on a printed circuit board or another integrated circuit by surface mount technology.

Preferred embodiments of the present invention have been described above, but the present invention is not restricted by such embodiments, and can be modified and changed in various ways within the scope of the claims.

What is claimed is:

1. A multi-quantum well infrared photo-detector, in which a plurality of multi-quantum well layers having respective sensitivities for different wavelength ranges of infrared are layered via a common contact layer, comprising:

a switch where one end is connected to said common contact layer; and a current integration unit which is connected to the other end of said switch;

wherein first and second voltages are applied to first and second contact layers at the opposite side of first and second multi-quantum well layers which are formed on and under said common contact layer respectively; said switch is conducted for a predetermined time so that either voltage between said common contact layer and the first contact layer or voltage between said common contact layer and the second contact layer becomes higher than the other; and said current integration unit is charged or discharged by the current which flows in said multi-quantum well layers.

2. The multi-quantum well infrared photo-detector according to claim 1, wherein said first and second voltages are alternately applied to the first and second contact layers in a time sequence, and the amount of current which flows responding to infrared in said difference wavelength ranges is detected via said current integration unit.

3. The multi-quantum well infrared photo-detector according to claim 1, wherein said switch has a conductance higher than said multi-quantum well layer.

4. The multi-quantum well infrared photo-detector according to claim 1, wherein said switch comprises a transistor where the source is connected to said common contact layer, the drain is connected to said current integration unit, and a control voltage is applied to the gate.

5. The multi-quantum well infrared photo-detector according to claim 4, wherein said current integration unit is comprised of a capacitor, said capacitor is reset to a predetermined voltage, and voltage of said capacitor, which changes according to current flowing in said multi-quantum well layer, is detected by a source follower transistor.

6. The multi-quantum well infrared photo-detector according to claim 4, wherein said current integration unit is comprised of feedback capacitance of an operational amplifier, said feedback capacitance is discharged and reset, and output voltage of said operational amplifier changes according to current which flows in said multi-quantum well layer.

7. The multi-quantum well infrared photo-detector according to claim 1, wherein said common contact layer where said switch is connected further comprises a current source which supplies current, roughly equal to dark current in said multi-quantum well layer.

8. The multi-quantum well infrared photo-detector according to claim 1, wherein voltage with same polarity is applied to said first and second contact layers simultaneously, and said current integration unit is charged or discharged by the sum of the currents flowing in said first and second multi-quantum well layers.

9. The multi-quantum well infrared photo-detector according to claim 1, wherein voltage with different polarity is applied to said first and second contact layers simultaneously, and said current integration unit is charged or discharged by the difference of the currents flowing in said first and second multi-quantum well layers.

10. The multi-quantum well infrared photo-detector according to claim 1, wherein the multi-quantum well infrared photo-detectors are arranged in a row or a matrix.

11. A photo-sensor comprising:

a support layer;

a first contact layer which is formed on said support layer and is isolated by an element isolation structure;

a first light absorbing layer which is formed on said first contact layer to absorb light with a first wavelength;

a first ohmic electrode which electrically contacts said first contact layer;

a second contact layer which is formed on said first light absorbing layer;

a second ohmic electrode which electrically contacts said second contact layer;

a second light absorbing layer which is formed on said second contact layer;

a third contact layer which is formed on said second light absorbing layer; and a third ohmic electrode which electrically contacts said third contact layer.

12. The photo-sensor according to claim 11, wherein said second ohmic electrode is grounded or grounded via a bias supply.

13. The photo-sensor according to claim 11, further comprising:

a high resistance layer formed on said third contact layer;

a first contact hole which is formed in said high resistance layer so as to expose said third contact layer;

a second contact hole which is formed in said high resistance layer penetrating said second light absorbing layer so as to expose said second contact layer; and a third contact hole which is formed in said high resistance layer penetrating said second light absorbing layer, said second contact layer, and said first light absorbing layer, so as to expose said first contact layer, wherein said third ohmic electrode is formed on said high resistance layer so as to contact said third contact layer in said first contact hole, said second ohmic electrode is formed on said high resistance layer so as to electrically contact the portion of said second contact layer exposed by said second contact hole via a first conductive pattern which extends on the side wall faces of said second contact hole, and said third ohmic electrode is formed on said high resistance layer so as to electrically contact the portion of said first contact layer exposed by said third contact hole via a second conductive pattern which extends on side wall faces of said third contact hole.

14. The photo-sensor according to claim 13, wherein said second contact hole has a first high resistance region formed in a portion where said first conductive pattern extends, and said third contact hole has a second high resistance region formed in a portion where said second conductive pattern extends.

15. An image sensor wherein a plurality of photo-sensors are arranged on a support layer and are mutually isolated by an element isolation structure, each of said photo-sensors comprising:

a first contact layer which is formed on said support layer and is isolated by an element isolation structure;

a first light absorbing layer which is formed on said first contact layer to absorb light with a first wavelength;

a first ohmic electrode which electrically contacts said first contact layer;

a second contact layer which is formed on said first light absorbing layer;

a second ohmic electrode which electrically contacts said second contact layer;

a second light absorbing layer which is formed on said second contact layer;

a third contact layer which is formed on said second light absorbing layer; and a third ohmic electrode which electrically contacts said third contact layer.

* * * * *